US008865511B2

(12) United States Patent
Yukawa et al.

(10) Patent No.: US 8,865,511 B2
(45) Date of Patent: Oct. 21, 2014

(54) SEMICONDUCTOR DEVICE AND METHOD FOR MANUFACTURING THE SAME

(75) Inventors: Mikio Yukawa, Atsugi (JP); Nobuharu Ohsawa, Zama (JP); Ryoji Nomura, Yamato (JP); Yoshinobu Asami, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 408 days.

(21) Appl. No.: 13/295,304

(22) Filed: Nov. 14, 2011

(65) Prior Publication Data

US 2012/0108029 A1     May 3, 2012

Related U.S. Application Data

(62) Division of application No. 11/918,611, filed as application No. PCT/JP2006/309125 on Apr. 25, 2006, now Pat. No. 8,101,943.

(30) Foreign Application Priority Data

Apr. 27, 2005    (JP) ................. 2005-130629

(51) Int. Cl.
| H01L 35/24 | (2006.01) |
| H01L 51/00 | (2006.01) |
| H01L 27/28 | (2006.01) |
| H01L 51/05 | (2006.01) |
| G11C 13/00 | (2006.01) |
| B82Y 10/00 | (2011.01) |

(52) U.S. Cl.
CPC .......... *G11C 13/0014* (2013.01); *H01L 27/285* (2013.01); *G11C 2213/77* (2013.01); *H01L 51/0591* (2013.01); *G11C 2213/79* (2013.01); *B82Y 10/00* (2013.01)
USPC ............................................. 438/82; 438/99

(58) Field of Classification Search
CPC ............ H01L 51/0072; H01L 51/0074; H01L 51/0085
USPC ....................................... 438/82, 99, E39.007
See application file for complete search history.

(56) References Cited

U.S. PATENT DOCUMENTS

| 5,883,397 A | 3/1999 | Isoda et al. |
| 6,548,825 B1 | 4/2003 | Yoshii et al. |

(Continued)

FOREIGN PATENT DOCUMENTS

| GB | 1352789 | 5/1974 |
| JP | 50-012598 B | 5/1975 |

(Continued)

OTHER PUBLICATIONS

Korean Office Action (Application No. 2007-7026559) Dated Jul. 4, 2012.

(Continued)

*Primary Examiner* — Cuong Q Nguyen
(74) *Attorney, Agent, or Firm* — Eric J. Robinson; Robinson Intellectual Property Law Office, P.C.

(57) ABSTRACT

It is an object of the present invention to provide a technique in which a high-performance and high reliable memory device and a semiconductor device provided with the memory device are manufactured at low cost with high yield. The semiconductor device includes an organic compound layer including an insulator over a first conductive layer and a second conductive layer over the organic compound layer including an insulator. Further, the semiconductor device is manufactured by forming a first conductive layer, discharging a composition of an insulator and an organic compound over the first conductive layer to form an organic compound layer including an insulator, and forming a second conductive layer over the organic compound layer including an insulator.

16 Claims, 25 Drawing Sheets

(56) References Cited

U.S. PATENT DOCUMENTS

| | | |
|---|---|---|
| 6,950,331 B2 | 9/2005 | Yang et al. |
| 7,482,621 B2 * | 1/2009 | Yang et al. ............... 257/40 |
| 7,956,352 B2 | 6/2011 | Yukawa et al. |
| 2004/0027849 A1 | 2/2004 | Yang et al. |
| 2009/0140231 A1 | 6/2009 | Yukawa et al. |

FOREIGN PATENT DOCUMENTS

| | | |
|---|---|---|
| JP | 62-259478 A | 11/1987 |
| JP | 07-022669 | 1/1995 |
| JP | 2001-261969 A | 9/2001 |
| JP | 2002-110999 A | 4/2002 |
| JP | 2003-309265 A | 10/2003 |
| JP | 2004-095850 | 3/2004 |
| JP | 2004-513513 | 4/2004 |
| WO | WO-02/37500 | 5/2002 |
| WO | WO 2004/070789 | 8/2004 |

OTHER PUBLICATIONS

International Search Report (Application No. PCT/JP2006/309125) dated Aug. 8, 2006.
Written Opinion (Application No. PCT/JP2006/309125) dated Aug. 8, 2006.
European Search Report (Application No. 06745976.8) dated Aug. 31, 2010.

* cited by examiner

FIG. 19A
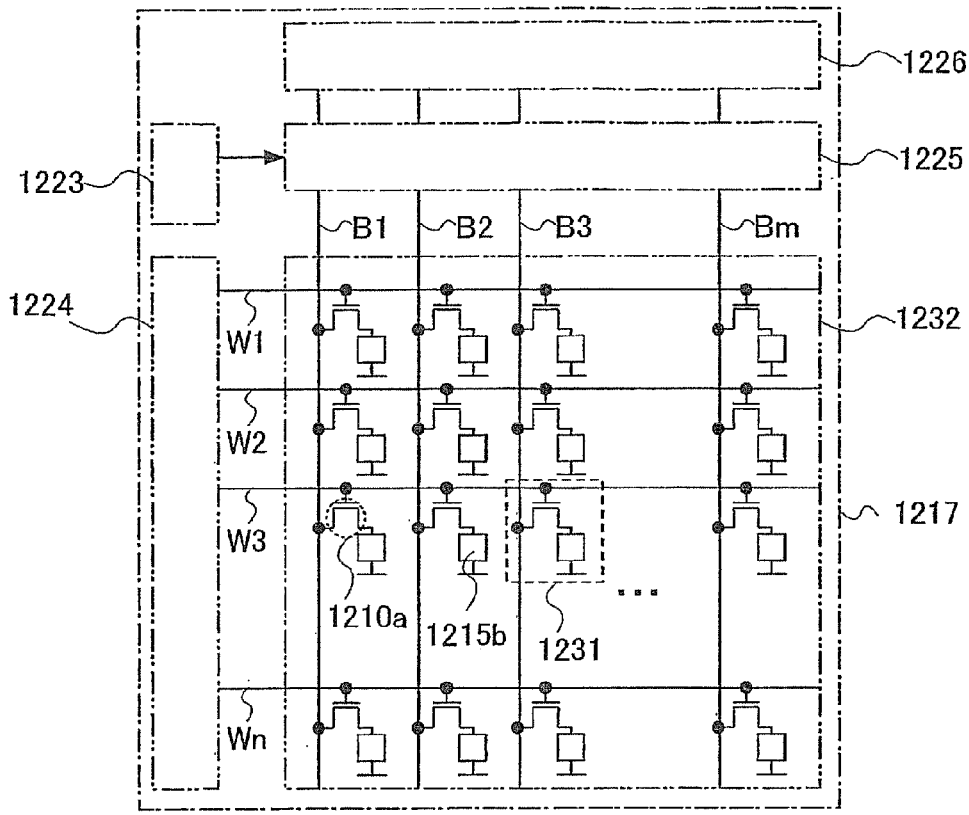
FIG. 19B
FIG. 19C
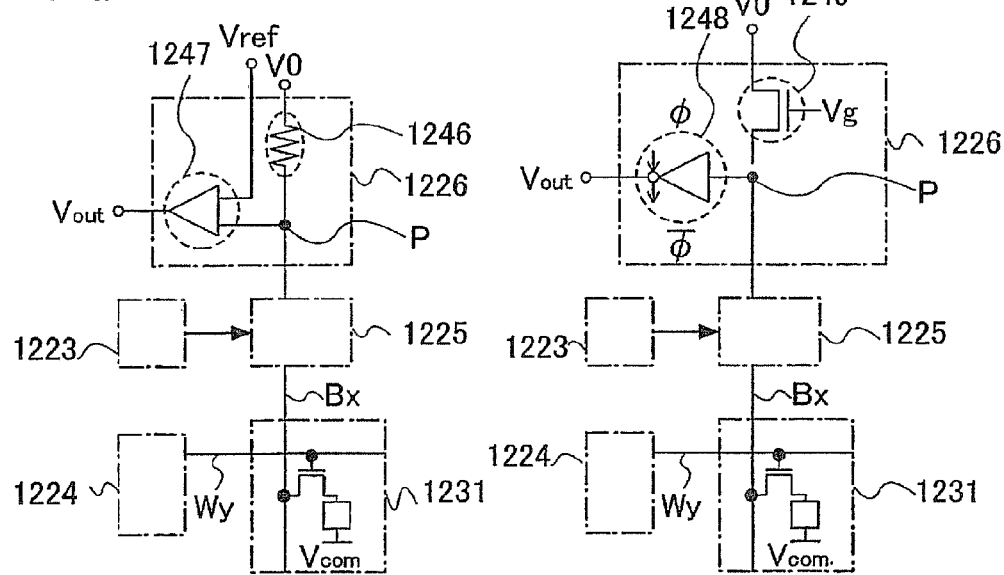

SEMICONDUCTOR DEVICE AND METHOD FOR MANUFACTURING THE SAME

TECHNICAL FIELD

The present invention relates to a semiconductor device and a method for manufacturing a semiconductor device.

BACKGROUND ART

In recent years, individual recognition technology has attracted attention. For example, there is a technology to be used for production and management, in which information such as a history of the object is clarified by giving an ID (an individual recognition code) to an individual object. Above all, the developments of semiconductor devices that can send and receive data without contact have been advanced. As such semiconductor devices, in particular, an RFID (Radio Frequency Identification) (also referred to as an ID tag, an IC tag, and IC chip, an RF (Radio Frequency) tag, a wireless tag, an electronic tag,) is beginning to be introduced into companies, markets, and the like.

Many of the semiconductor devices have a circuit using a semiconductor substrate such as silicon (Si) substrate (hereinafter, also referred to as an IC (Integrated Circuit) chip) and an antenna, and the IC chip includes a memory circuit (hereinafter, also referred to as a memory) and a control circuit. Further, an organic thin film transistor (hereinafter, also referred to as a TFT) using an organic compound for the control circuit and a memory circuit has been actively developed (for example, Patent Document 1).
Japanese Patent Application Laid-Open No. H7-22669

DISCLOSURE OF INVENTION

However, in the case of a memory circuit using an organic compound that is provided between a pair of electrodes to form a memory element, there are following problems depending on a size of the memory circuit: when a film thickness of the organic compound layer is thick, a writing voltage increases. Alternatively, when a size of an element is small and a thickness of the organic compound layer is thin, variation in characteristics of a memory (a writing voltage and the like) is caused and normal writing can not be performed because the organic compound is to be easily affected by dust and an unevenness shape of a surface of an electrode layer.

Therefore, it is an object of the present invention to provide a technique in which a memory device and a semiconductor device provided with the memory device, each of which have high-performance and high reliability can be manufactured at low cost with high yield.

In the present invention, an organic compound including a plurality of insulators is formed, which is provided between a pair of conductive layers forming a memory element in a semiconductor device. The insulators in the organic compound layer exist inside of the organic compound layer and at the interfaces with the conductive layers. The organic compound layer including an insulator can control a concentration of the insulators in the layer depending on a material and a forming method thereof. Therefore, the insulators may be dispersed evenly in the organic compound layer, and the insulators may be dispersed unevenly so that the concentration of the insulators in the organic compound layer is to be different. A tunnel injection becomes possible due to the insulators at the interfaces of the conductive layers and the organic compound layer, and then, a tunnel current flows.

Therefore, by applying a voltage between a first conductive layer and a second conductive layer, the current flows in the organic compound, which generates heat (Joule heat). Then, when a temperature of the organic compound layer rises to a glass-transition temperature, a material forming the organic compound layer becomes a composition having fluidity. The composition having fluidity flows without keeping a shape of a solid state. Therefore, a film thickness of the organic compound is uneven due to an influence of Joule heat and high electric field, and the organic compound layer is transformed. Then, a part of the first conductive layer and the second conductive layer is in contact with each other, and the memory element is short-circuited. Accordingly, conductivity of the memory element is changed before and after of applying the voltage.

Since an insulator does not transport carriers, a carrier transporting property of the entire organic compound layer is reduced due to obstruction of the insulator. Therefore, a current value that is necessary for short-circuit (writing into a element) is reduced even in an organic compound material having a high carrier transporting property; thus an advantage such as low power consumption and expansion of selection range of a material is brought. Further, a mixed layer including an insulator hardly causes a defect due to crystallization of an organic compound, and stabilizes a state of an organic compound layer (morphology) rather than a single layer of an organic compound. Therefore, manufacturing a defective element that is short-circuited between conductive layers can be prevented in an initial state, and yield is improved.

It is to be noted that a semiconductor device in the present specification indicates a device capable of operating by utilizing semiconductor characteristics. By using the present invention, an integrated circuit having a multi-layer wiring and a semiconductor device such as a processor chip can be manufactured.

One aspect of a semiconductor device of the present invention has a memory element, which includes an organic compound layer including an insulator over a first conductive layer and a second conductive layer over the organic compound including layer an insulator.

The semiconductor device has a memory element that includes an organic compound layer including an insulator over the first conductive layer and a second conductive layer over the organic compound layer including an insulator. The organic compound layer including an insulator has a concentration gradient of the insulator.

The concentration gradient of the insulator in the above organic compound layer can be controlled as follows depending on a material and a manufacturing method. A semiconductor device in which a concentration of the insulator in an organic compound layer at an interface of the organic compound layer including an insulator and a first conductive layer is higher than that at an interface of the organic compound layer including an insulator and a second conductive layer; a semiconductor device in which a concentration of an insulator in an organic compound layer at an interface of the organic compound layer including an insulator and a second conductive layer is higher that at an interface of the organic compound layer including an insulator and a first conductive layer; a semiconductor device in which a concentration of an insulator in an organic compound layer at an interface of the organic compound including an insulator and a first conductive layer and at an interface of the organic compound including an insulator and a second conductive layer is highest in the organic compound including an insulator; and the like can be manufactured.

In the present specification, a high concentration indicates a high existing probability and a large quantity of distribution of an insulator. These concentrations can be represented as a volume ratio, a weight ratio, a composition ratio, and the like by properties of matter of a material.

One aspect of a method for manufacturing a semiconductor device of the present invention includes the steps of forming a first conductive layer, forming an organic compound layer including an insulator over the first conductive layer, and forming a second conductive layer over the organic compound layer including an insulator to form a memory element.

Another aspect of a method for manufacturing a semiconductor device includes the steps of forming a first conductive layer, discharging and solidifying a composition including an insulator and an organic compound over the first conductive layer to form an organic compound layer including an insulator, and forming a second conductive layer over the organic compound layer including an insulator to form a memory element.

Another aspect of a method for manufacturing a semiconductor device includes the steps of forming a first conductive layer, forming an organic compound layer over the first conductive layer, adding an insulator to the organic compound layer to form an organic compound layer including an insulator, and forming a second conductive layer over the organic compound layer including an insulator to form a memory element.

In accordance with the present invention, a memory element and a semiconductor device, each of which has high-performance and high reliability, can be manufactured at low cost with high yield.

BRIEF DESCRIPTION OF DRAWINGS

FIGS. 19A to 19C are diagrams describing a memory device of the present invention;

BEST MODE FOR CARRYING OUT THE INVENTION

Figure 1:
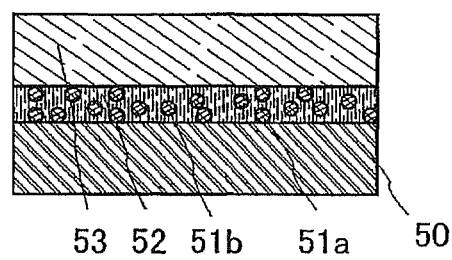
FIG. 1 is a schematic view describing the present invention.

Embodiment modes of the present invention will be described in detail with reference to the accompanying drawings. However, it is to be easily understood that various changes and modifications will be apparent to those skilled in the art, unless such changes and modifications depart from the content and the scope of the invention. Therefore, the present invention is not construed as being limited to the description of the following Embodiment modes. It is to be noted that the same portion or a portion having the same function is denoted by the same reference numeral in all the drawings, and the description thereof is omitted.

Embodiment Mode 1

In the present embodiment mode, an example of a structure of a memory element included in a memory device of the present invention will be described with reference to drawings.

A memory element of the present invention and an operating mechanism thereof are described with reference to FIG. 1. In the present embodiment mode, an organic compound, which is provided by being interposed between a pair of conductive layers that forms a memory element included in a memory device, is formed so as to include a plurality of insulators. Then, the organic compound is made to be an organic compound layer including a plurality of insulators. By having an organic compound layer including an insulator, characteristics of a memory element is stabilized without variation, and normal writing can be performed.

The insulators in the organic compound layer may be distributed evenly or distributed unevenly so that the organic compound layer has a concentration gradient of the insulators. Mixed condition of the insulators in the organic compound layer is different depending on a material and a forming method, and the concentration can be controlled.

A memory element shown in FIG. 1 is an example of a memory element of the present invention, in which an organic compound layer 52 including an insulator 51a and an insulator 51b is formed over a first conductive layer 50, and a second conductive layer 53 is formed over the organic compound layer 52.

As a material for the first conductive layer 50 and the second conductive layer 53, an element, a compound, or the like having high conductivity is used. As a material for the organic compound layer 52 in the present embodiment mode, a substance the crystallinity, conductivity, and a shape of which are changed by electric action is used. Since a memory element having the above structure has conductivity that changes before and after of applying a voltage, the memory element can memorizes two values corresponding to "initial state" and "after change of conductivity". The change in conductivity of the memory element before and after applying a voltage will be described.

In the present embodiment mode, the organic compound layer 52 including the insulator 51a and the insulator 51b, which forms a memory element included in a memory device, is formed over the first conductive layer 50. When a voltage is applied between the first conductive layer 50 and the second conductive layer 53, a current flows to the organic compound layer 52 to generate heat. Then, when a temperature of the organic compound layer 52 increases to a glass-transition temperature, a material forming the organic compound layer 52 becomes a composition having fluidity. The composition having fluidity flows without keeping a shape of a solid state. Therefore, a film thickness of the organic compound layer 52 becomes uneven due to an influence of Joule heat and high electric field, and the organic compound layer is transformed. Then, the first conductive layer 50 and the second conductive layer 53 are connected with each other. As a result, the first conductive layer 50 and the second conductive layer 53 are short-circuited. Therefore, the conductivity of the memory element is changed before and after applying a voltage.

A tunnel injection of carriers from the first conductive layer 50 to the organic compound layer 52 becomes possible by the insulator 51a existing at an interface of the organic compound layer 52 and the first conductive layer 50. Accordingly, characteristics of a writing voltage of a memory element and the like are stabilized without variation, and normal writing in each element can be performed. Further, since a plurality of insulators is mixed in the organic compound layer, morphology of the organic compound layer is stabilized. Furthermore, since a carrier injection property is improved by the tunnel injection, a film thickness of the organic compound layer can be also increased. Therefore, a defect in which a memory element is short-circuited in the initial state before having conductivity can be prevented.

Since the insulator 51b existing in the organic compound layer 52 does not transport carriers, a carrier transporting property of the entire organic compound layer 52 is reduced due to obstruction of the insulator 51b. Therefore, a current value that is necessary for short-circuit (writing into a element) is reduced even in a case of an organic compound material having a high carrier transporting property; thus, an advantage such as low power consumption and expansion of selection range of a material is brought.

FIG. 1 shows an example where the insulator 51b, and the insulator 51a existing at the interface of the first conductive layer 50 are included in the organic compound layer 52; however, the present invention is not limited thereto as far as an insulator is included in an organic compound. Therefore, both of the insulator 51a and the insulator 51b are not necessary to exist, and a structure in which either one exists may be employed.

As a voltage that is applied to a memory element of the present invention, a voltage that is applied to a first conductive layer may be higher than a voltage that is applied to a second conductive layer. Alternatively, a voltage that is applied to the second conductive layer may be higher than a voltage that is applied to the first conductive layer. In the case where a memory element has rectification, a potential difference may be provided between the first conductive layer and the second conductive layer so as to apply a voltage in the direction of forward bias. Alternatively, a potential difference may be provided between the first conductive layer and the second conductive layer so as to apply a voltage in the direction of reverse bias.

In the present invention, an organic compound layer including a plurality of insulators, which is provided between a pair of conductive layers by mixing the plurality of insulators, is used. Mixed condition of the plurality of insulators into the organic compound layer is different depending on a material, a forming method, or the like. The organic compound layer including an insulator shown in FIG. 1 is an example where the insulators are dispersed almost evenly in the organic compound layer, and a concentration thereof is even. Insulators may be mixed evenly in an organic compound layer as FIG. 1; alternatively, insulators may be mixed unevenly so that the organic compound layer has a concentration gradient of the insulators. An example of mixed condition of insulators in an organic compound layer is described with reference to FIGS. 16A to 16C.

Figure 16A:
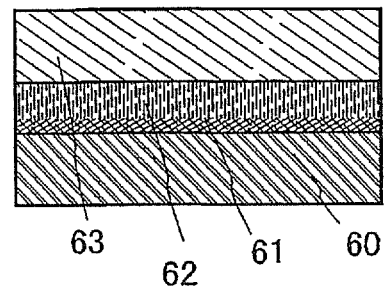
FIGS. 16A to 16C are views describing a memory device of the present invention.

A memory element shown in FIG. 16A is an example of a memory element of the present invention, in which an organic compound layer 62 including an insulator mixed region 61 is formed over a first conductive layer 60, and a second conductive layer 63 is formed over the organic compound layer 62. The organic compound layer 62 has a concentration gradient of insulators mixed therein, and the insulators exist unevenly in the organic compound layer 62. The insulator mixed region 61 is formed in the vicinity of an interface of the organic compound layer 62 and the first conductive layer 60. Accordingly, in the organic compound layer 62, a concentration of the insulators at the interface of the organic compound layer 62 and the first conductive layer 60 is highest in the organic compound layer 62. The insulator mixed region does not have a clear interface with a non-insulator mixed region. Accordingly, the insulator mixed region can have a structure in which a concentration of the insulators is changed gradually as approaching the second conductive layer 63 in the direction of the film thickness in the organic compound layer.

Figure 16B:
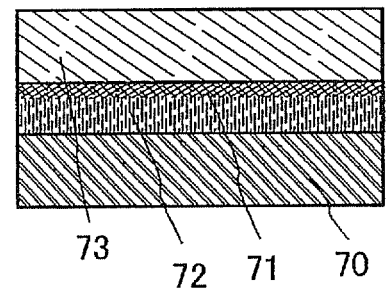

A memory element shown in FIG. 16B is an example of a memory element of the present invention, in which an organic compound layer 72 including an insulator mixed region 71 is formed over a first conductive layer 70, and a second conductive layer 73 is formed over the organic compound layer 72. The organic compound layer 72 has a concentration gradient of insulators mixed therein, and the insulators exist unevenly in the organic compound layer 72. The insulator mixed layer 71 is formed in the vicinity of an interface of the organic compound layer 72 and the second conductive layer 73. Therefore, a concentration of the insulators at the interface of the organic compound layer 72 and the second conductive layer 73 is highest in the organic compound layer 72. The insulator mixed region does not have a clear interface with a non-insulator mixed layer. Accordingly, the insulator mixed region can have a structure in which a concentration of the insulators is changed gradually as approaching the second conductive layer 73 in the direction of the film thickness.

Figure 16C:
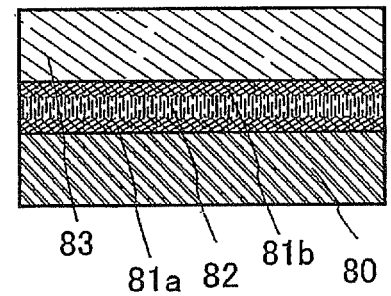

A memory element shown in FIG. 16C is an example of a memory element of the present invention, in which an organic compound layer 82 including an insulator mixed region 81a and an insulator mixed region 81b is formed over a first conductive layer 80, and a second conductive layer 83 is formed over the organic compound layer 82. The organic compound layer 82 has a concentration gradient of insulators mixed therein, and the insulators exist unevenly in the organic compound layer 82. In the organic compound layer 82, the insulator mixed region 81a is formed in the vicinity of an interface with the first conductive layer 80, and the insulator mixed layer 81*b* is formed in the vicinity of an interface with the second conductive layer 83. Therefore, a concentration of the insulators at the interface of the organic compound layer 82 and the first conductive layer 80 and at the interface of the organic compound layer 82 and the second conductive layer 83 is highest in the organic compound layer 82. The insulator mixed region does not have a clear interface with a non-insulator mixed region; accordingly, a concentration of the insulators is changed gradually. The organic compound layer 82 can have a structure in which the concentration of the insulators becomes higher as approaching the first conductive layer 80 and the second conductive layer 83 in the direction of the film thickness direction; and the insulators is included at a low concentration in the middle part.

An organic compound including a plurality of insulators may be formed in one process by mixing a plurality of insulators and an organic compound. Alternatively, either one may be formed in advance to introduce (add) the other in another process. In a case of forming the organic compound layer including a plurality of insulators in one process, a dry process such as a co-evaporation method and sputtering may be employed. In addition, a mixed material of a plurality of insulators and an organic compound may be used to form the organic compound layer including a plurality of insulators into a film by a wet process such as a coating method. The insulators in the organic compound layer are distributed so that a concentration of the insulators can be controlled to be a predetermined concentration by using the above forming method.

In the case of wet type, the insulators and the organic compound may be dissolved in a solvent, and even if insoluble, they may be dispersed to be mixed. Therefore, a colloid solution in which a plurality of insulators are in fine particles of approximately 0.1 μm to 0.001 μm (also referred to as colloid particles) to be dispersed in liquid can be used. The materials may have any shapes such as particle shape, columnar shape, needle shape, or planar shape. Further, the insulators may be aggregated to form an aggregation. A layer having a concentration gradient may be formed due to a difference of specific gravity and solubility between the insulators and the organic compound. For example, a concentration of the insulators at the vicinity of the interface of the organic compound layer and the conductive layer can be controlled by an insulator concentration that is capable of causing a tunnel injection. Alternatively, a concentration of the insulators inside of the organic compound layer can be controlled by an insulator concentration that can save a carrier transporting property necessary for a memory element. By forming an organic compound layer including an insulator in one process in such a manner, the number of processes can be simplified.

The organic compound including an insulator can be formed by using an evaporation method such as an electron beam evaporation method and a co-evaporation method; sputtering, a CVD method; a coating method such as a spin coat method using a mixed solution; and a sol-gel method. The organic compound layer including an insulator can be formed by depositing each material concurrently by combining the same or different methods such as a co-evaporation method of resistance heating evaporation, a co-evaporation method of electron beam evaporation, a co-evaporation method of resistance heating evaporation and electron beam evaporation, deposition of resistance heating evaporation and sputtering, and deposition of electron beam evaporation and sputtering. Further, a droplet discharging (jetting) method (also referred to as an inkjet method depending on its system) in which a droplet of a compound blended for a specific purpose can be discharged (jetted) selectively to form a predetermined shape; a dispenser method; a method in which an object can be transferred or described into a predetermined shape, for example, various printing methods (a method for forming an object into a predetermined shape such as screen (mimegraph) printing, offset (planography) printing, relief printing, and gravure (intaglio) printing); and the like can be also used. Furthermore, instead of forming the organic compound layer including an insulator concurrently, after forming an organic compound layer, insulators may be introduced by an ion injecting method, a doping method, or the like to form a mixed layer of the insulator and the organic compound.

In the present invention, as for an insulator to be mixed into an organic compound layer, a thermally and chemically stable inorganic insulator or organic compound in which carriers are not injected are used. An insulator mixed into an organic compound layer in which electric conductivity is $10^{-10}$ s/m or less can be preferably used, and more preferably, an insulator mixed into an organic compound layer in which electric conductivity is $10^{-10}$ s/m or more and $10^{-14}$ s/m or less can be used. Specific examples of an inorganic insulator and an organic compound that can be used for an insulator will be described below.

In the present invention, as an inorganic insulator that can be used for an insulator mixed into an organic compound layer, an oxide such as lithium oxide ($Li_2O$), sodium oxide ($Na_2O$), potassium oxide ($K_2O$,) rubidium oxide ($Rb_2O$), beryllium oxide (BeO), magnesium oxide (MgO), calcium oxide (CaO), strontium oxide (SrO), barium oxide (BaO), scandium oxide ($Sc_2O_3$), zirconium oxide ($ZrO_2$), hafnium oxide ($HfO_2$), rutherfordium oxide ($RfO_2$), tantalum oxide (TaO), technetium oxide (TcO), ion oxide ($Fe_2O_3$), cobalt oxide (CoO), palladium oxide (PdO), silver oxide ($Ag_2O$), aluminum oxide ($Al_2O_3$), gallium oxide ($Ga_2O_3$), or bismuth oxide ($Bi_2O_3$) can be used.

In the present invention, as another inorganic insulator that can be used for an insulator mixed into an organic compound layer, a fluoride such as lithium fluoride (LiF), sodium fluoride (NaF), potassium fluoride (KF), rubidium fluoride (RbF), beryllium fluoride ($BeF_2$), magnesium fluoride ($MgF_2$), calcium fluoride ($CaF_2$), strontium fluoride ($SrF_2$), barium fluoride ($BaF_2$), aluminum fluoride ($AlF_3$), nitrogen trifluoride (NF3), sulfur hexafluoride ($SF_6$), silver fluoride (AgF), or manganese fluoride $MnF_3$ can be used.

In the present invention, as another inorganic insulator that can be used for an insulator mixed into an organic compound layer, a chloride such as lithium chloride (LiCl), sodium chloride (NaCl), potassium chloride (KCl), beryllium chloride ($BeCl_2$), calcium chloride ($CaCl_2$), barium chloride ($BaCl_2$), aluminum chloride ($AlCl_3$), silicon chloride ($SiCl_4$), germanium chloride ($GeCl_4$), tin chloride ($SnCl_4$), silver chloride (AgCl), zinc chloride (ZnCl), titanium tetrachloride ($TiCl_4$), titanium trichloride ($TiCl_3$), zirconium chloride ($ZrCl_4$), iron chloride ($FeCl_3$), palladium chloride ($PdCl_2$), antimony (III) chloride ($SbCl_3$), antimony chloride ($SbCl_2$), strontium chloride ($SrCl_2$), thallium chloride (TlCl), copper chloride (CuCl), manganese chloride ($MnCl_2$), or ruthenium chloride ($RuCl_2$) can be used.

In the present invention, as another inorganic insulator that can be used for an insulator mixed into an organic compound layer, a bromide such as potassium bromide (KBr), cesium bromide (CsBr), silver bromide (AgBr), barium bromide (BaBr), silicon bromide ($SiBr_4$), or lithium bromide (LiBr) can be used.

In the present invention, as another inorganic insulator that can be used for an insulator mixed into an organic compound layer, an iodide such as sodium iodide (NaI), potassium iodide (KI), barium iodide (BaI$_2$), thallium iodide (TlI), silver iodide (AgI), titanium iodide (TiI$_4$), calcium iodide (CaI$_2$), silicon iodide (SiL$_4$), or cesium iodide (CsI) can be used.

In the present invention, as another inorganic insulator that can be used for an insulator mixed into an organic compound layer, a carbonate such as lithium carbonate (Li$_2$CO$_3$), potassium carbonate (K$_2$CO$_3$), sodium carbonate (Na$_2$CO$_3$), magnesium carbonate (MgCO$_3$), calcium carbonate (Ca$_2$CO$_3$), strontium carbonate (SrCO$_3$), barium carbonate (BaCO$_3$), manganese carbonate (MnCO$_3$), iron carbonate (FeCO$_3$), cobalt carbonate (CoCO$_3$), nickel carbonate (NiCO$_3$), cupper carbonate (CuCO$_3$), silver carbonate (Ag$_2$CO$_3$), or zinc carbonate (ZnCO$_3$) can be used.

In the present invention, as another inorganic insulator that can be used for an insulator mixed in an organic compound layer, a sulfate such as lithium sulfate (LiSO$_4$), potassium sulfate (K$_2$SO$_4$), sodium sulfate (Na$_2$SO$_4$), magnesium sulfate (MgSO$_4$), calcium sulfate (CaSO$_4$), strontium sulfate (SrSO$_4$), barium sulfate (BaSO$_4$), titanium sulfate (Ti(SO$_4$)$_3$), zirconium sulfate (Zr(SO$_4$)$_2$), manganese sulfate (MnSO$_4$), iron sulfate (FeSO$_4$), ferric sulfate (Fe$_2$(SO$_4$)$_3$), cobalt sulfate (CoSO$_4$), cobalt sulfate (CO$_2$(SO$_4$)$_3$), nickel sulfate (NiSO$_4$), cupper sulfate (CuSO$_4$), silver sulfate (Ag$_2$SO$_4$), zinc sulfate (ZnSO$_4$), aluminum sulfate (Al$_2$(SO$_4$)$_3$), indium sulfate (In$_2$(SO$_4$)$_3$), tin sulfate (SnSO$_4$), tin sulfate (Sn(SO$_4$)$_2$), antimony sulfate (Sb$_2$(SO$_4$)$_3$), or bismuth (III) sulfate (Bi$_2$(So$_4$)$_3$) can be used.

In the present invention, as another inorganic insulator that can be used for an insulator mixed into an organic compound layer, a nitrate such as lithium nitrate (LiNO$_3$), potassium nitrate (KNO$_3$), sodium nitrate (NaNO$_3$), magnesium nitrate (Mg(NO$_3$)$_2$), calcium nitrate (Ca(NO$_3$)$_2$), strontium nitrate (Sr(NO$_3$)$_2$), barium nitrate (Ba(NO$_3$)$_2$), titanium nitrate (Ti(NO$_3$)$_4$), strontium nitrate (Sr(NO$_3$)$_2$), barium nitrate (Ba(NO$_3$)$_2$), zirconium nitrate (Zr(NO$_3$)$_4$), manganese nitrate (Mn(NO$_3$)$_2$), iron nitrate (Fe(NO$_3$)$_2$), iron nitrate (Fe(NO$_3$)$_3$), cobalt nitrate (Co(NO$_3$)$_2$), nickel nitrate (Ni(NO$_3$)$_2$), cupper nitrate (Cu(NO$_3$)$_2$), silver nitrate (AgNO$_3$), zinc nitrate (Zn(NO$_3$)$_2$), aluminum nitrate (Al(NO$_3$)$_3$), indium nitrate (In(NO$_3$)$_3$), tin nitrate (Sn(NO$_3$)$_2$), or bismuth (III) nitrate (Bi(NO$_3$)$_3$) can be used.

In the present invention, as another inorganic insulator that can be used for an insulator mixed into an organic compound layer, a nitride such as aluminum nitrite (AlN) and silicon nitrite (SiN); and a carboxylate such as lithium carboxylate (CH$_3$COOLi), potassium acetate (CH$_3$COOK), sodium acetate (CH$_3$COONa), magnesium acetate (Mg(CH$_3$COO)$_2$), calcium acetate (Ca(CH$_3$COO)$_2$), strontium acetate (Sr(CH$_3$COO)$_2$), or barium acetate (Ba(CH$_3$COO)$_2$) can be used.

In the present invention, as an inorganic insulator that can be used for an insulator mixed into an organic compound layer, one or plural kinds of the above inorganic insulators can be used.

In the present invention, as an organic compound that can be used for an insulator mixed into an organic compound layer, a compound in which carriers are difficult to be injected and a band gap is 3.5 eV or more, preferably, 4 eV or more and 6 eV or less, can be used. For example, polyimide, acrylic, polyimide, benzocyclobutene, polyester, a novolac resin, a melamine resin, a phenol resin, an epoxy resin, a silicon resin, a furan resin, a diallyl phthalate resin, or a siloxane resin can be used. It is to be noted that the siloxane resin corresponds to resin including a Si—O—Si bond. Siloxane includes a skeleton structure formed from a bond of silicon (Si) and oxygen (O).

In the present invention, as an organic compound that can be used for an insulator mixed into an organic compound layer, one or plural kinds of the above organic compounds can be used.

In the present invention, as an insulator mixed into an organic compound layer, one or plural kinds of the above inorganic insulators and organic compounds can be used.

Further, an element, a compound, or the like having high conductivity is used for the first conductive layer 50, the first conductive layer 60, the first conductive layer 70, the first conductive layer 80, the second conductive layer 53, the second conductive layer 63, the second conductive layer 73, and the second conductive layer 83. Typically, a single layer or a stacked layer formed using one element selected from gold (Au), platinum (Pt), nickel (Ni), tungsten (W), molybdenum (Mo), iron (Fe), cobalt (Co), copper (Cu), palladium (Pd), carbon (C), aluminum (Al), manganese (Mn), and titanium (Ti) or an alloy containing a plurality of the elements can be used. As the alloy containing a plurality of the elements, for example, an alloy containing Al and Ti, an alloy containing Al, Ti, and C, an alloy containing Al and Ni, an alloy containing Al and C, an alloy containing Al, Ni, and C, an alloy containing Al and Mo, or the like can be used.

The first conductive layer 50, the first conductive layer 60, the first conductive layer 70, the first conductive layer 80, the second conductive layer 53, the second conductive layer 63, the second conductive layer 73, and the second conductive layer 83 can be formed by using an evaporation method, sputtering, a CVD method, a printing method, a dispenser method, or a droplet discharging method.

One or both of the first conductive layer 50, the first conductive layer 60, the first conductive layer 70, and the first conductive layer 80; and the second conductive layer 53, the second conductive layer 63, the second conductive layer 73, and the second conductive layer 83 may be provided so as to transmit light. A light-transmitting conductive layer is formed of a transparent conductive material. Alternatively, the light-transmitting conductive layer may be formed with a thickness so that light can pass therethrough when the transparent conductive layer is not used. As the transparent conductive material, indium tin oxide (ITO), zinc oxide (ZnO), indium zinc oxide (IZO), zinc oxide added with gallium (GZO), or other light-transmitting oxide conductive materials such as an indium oxide containing tungsten oxide, an indium zinc oxide containing tungsten oxide, an indium oxide containing titanium oxide, or an indium tin oxide containing titanium oxide can be used. Indium tin oxide and silicon oxide (hereinafter, referred to as ITSO), or an oxide conductive material formed using a target in which 2 wt % to 20 wt % of zinc oxide (ZnO) is mixed into indium oxide containing silicon oxide may be used.

The organic compound layer 52, the organic compound layer 62, the organic compound layer 72, and the organic compound layer 82 are formed using an organic compound, an organic compound of which the conductivity is changed by electric action, or a layer in which an organic compound and an inorganic compound are mixed.

As an inorganic insulator that can form the organic compound layer 52, the organic compound layer 62, the organic compound layer 72, and the organic compound layer 82, silicon oxide, silicon nitride, silicon oxynitride, silicon nitride oxide, or the like can be used.

As an organic compound that can form the organic compound layer 52, the organic compound layer 62, the organic compound layer 72, and the organic compound layer 82, an organic resin typified by polyimide, acrylic, polyimide, benzocyclobutene, an epoxy resin, or the like can be used.

Further, as an organic compound of which the conductivity is changed by electric action, which can form the organic compound layer 52, the organic compound layer 62, the organic compound layer 72, and the organic compound layer 82, an organic compound material that has a hole transporting property or an organic compound material that has an electron transporting property can be used.

As an organic compound material having a hole transporting property, an aromatic amine compound (in other words, a compound having a benzene ring-nitrogen bond) such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4''-tris(N,N-diphenyl-amino)-triphenylamine (abbreviation: TDATA), 4,4',4''-tris[N-(3-methylphenyl)-N-phenyl-amino]-triphenyl-amine (abbreviation: MTDATA), or 4,4'-bis(N-(4-(N,N-di-m-tolylamino)phenyl)-N-phenylamino)biphenyl (abbreviation: DNTPD); or a phthalocyanine compound such as phthalocyanine (abbreviation: $H_2Pc$), copper phthalocyanine (abbreviation: CuPc), or vanadyl phthalocyanine (abbreviation: VOPc) can be used. The substances described here are mainly substances having hole mobility of $10^{-6}$ $cm^2/Vs$ or more, further preferably, $10^{-6}$ $cm^2/Vs$ or more and $10^{-2}$ $cm^2/Vs$ or less.

As an organic compound material having a electron transporting property, a material formed of a metal complex having a quinoline skeleton or a benzoquinoline skeleton such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq), or the like can be used. Alternatively, a material of a metal complex having an oxazole or thiazole ligand such as bis[2-(2-hydroxyphenyl)benzoxazolate]zinc (abbreviation: $Zn(BOX)_2$) or bis[2-(2-hydroxyphenyl)benzothiazolate]zinc (abbreviation: $Zn(BTZ)_2$), or the like can be used. In addition to the metal complex, 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); or the like can be used. The substances described here are mainly substances having electron mobility of $10^{-6}$ $cm^2/Vs$ or more, further preferably, $10^{-6}$ $cm^2/Vs$ or more and $10^{-2}$ $cm^2/Vs$ or less.

In the present invention, as an organic compound material that can be used for an organic compound layer, one or plural kinds of the above organic compound materials can be used.

It is to be noted that the organic compound layer 52, the organic compound layer 62, the organic compound layer 72, and the organic compound layer 82 are formed to have such a film thickness that conductivity of the memory element is changed by electric action.

In addition, a rectifying element may be provided between the first conductive layer 50 and the organic compound layer 52; the first conductive layer 60 and the organic compound layer 62; the first conductive layer 70 and the organic compound layer 72; and the first conductive layer 80 and the organic compound layer 82, respectively. The rectifying element typically refers to a transistor or a diode in which a gate electrode and a drain electrode are connected. For example, a PN junction diode provided by stacking an n-type semiconductor layer and a p-type semiconductor layer can be used. In this manner, since a current flows only in one direction by providing the diode having rectification, errors are reduced and margin of reading is improved. In the case of providing a diode, not only a diode having a PN junction but also a diode having another structure such as a diode having a PIN junction or an avalanche diode may be provided. It is to be noted that the rectifying element may be provided between the organic compound layer 52, the organic compound layer 62, the organic compound layer 72, and the organic compound layer 82; and the second conductive layer 53, the second conductive layer 63, the second conductive layer 73, and the second conductive layer 83.

In accordance with the memory element of the present invention, characteristics of a writing voltage of the memory element and the like are stabilized without variation; therefore, normal writing in each element can be performed. Further, since a carrier injecting property is improved by a tunnel current of the insulator, a film thickness of an organic compound layer can be increased. In addition, since a defect inside of a layer such as crystallization can be prevented due to a mixed layer of an insulator and an organic compound, a state of the organic compound layer is stabilized. Therefore, a defect in which the memory element is short-circuited in an initial state before having conductivity can be prevented. As a result, a memory device and a semiconductor device, each of which has high reliability, can be provided with high yield.

Embodiment Mode 2

In the present embodiment mode, an example of a structure of a memory element included in a memory device of the present invention will be described with reference to drawings.

The memory element shown in Embodiment Mode 1 shows an example in which a plurality of insulators are mixed into the organic compound layer provided between a pair of conductive layers. In the present embodiment, the insulators are mixed into at least one of the pair of the conductive layers provided as electrodes as well as into the organic compound layer.

Figure 17A:
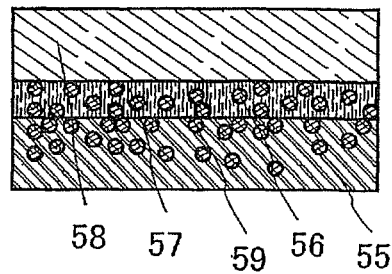
FIGS. 17A to 17C are views describing a memory device of the present invention.

A memory element shown in FIG. 17A is an example of a memory element of the present invention, in which an organic compound layer 57 including a first insulator 56 is formed over a first conductive layer 55 including a second insulator 59, and a second conductive layer 58 is formed over the organic compound layer 57.

Figure 17B:
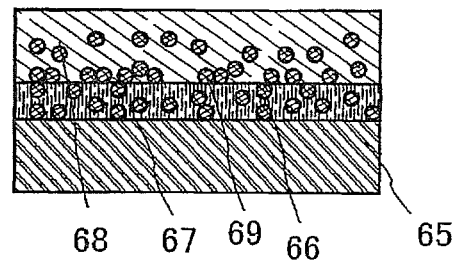

A memory element shown in FIG. 17B is an example of a memory element of the present invention, in which an organic compound layer 67 including a first insulator 66 is formed over a first conductive layer 65, and a second conductive layer 68 including a second insulator 69 is formed over the organic compound layer 67.

Figure 17C:
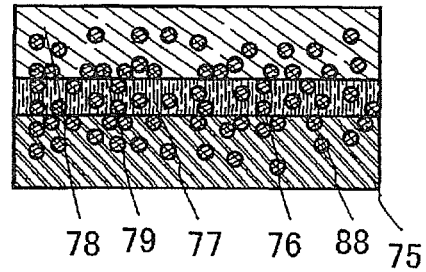

A memory element shown in FIG. 17C is an example of a memory element of the present invention, in which an organic compound layer 77 including a first insulator 76 is formed over a first conductive layer 75 including a second insulator 88, and a second conductive layer 78 including a third insulator 79 is formed over the organic compound layer 77.

FIGS. 17A to 17C are schematic views showing an example in which a plurality of particulate insulators are mixed in the organic compound layer and the conductive layers so as to describe a plurality of insulators mixed in the organic compound layer and the conductive layers clearly. Therefore, a size of the insulators and a mixed state are not necessary to be the same as the states shown in FIGS. 17A to 17C. A concentration of the insulator and the like can be controlled arbitrarily as shown in FIGS. 16A to 16C depending on a material used for an organic compound and a conductive layer, and a forming method. The mentioned above can be employed in other drawings in the present specification.

Each of the first conductive layer 55, the first conductive layer 65, the first conductive layer 75, the second conductive layer 58, the second conductive layer 68, and the second conductive layer 78 can be formed by using any one of the materials and the forming methods of the first conductive layer 50 and the second conductive layer 53 described in Embodiment Mode 1.

Further, the first insulator 56, the first insulator 66, the first insulator 76, the second insulator 59, the second insulator 69, the second insulator 79, the third insulator 88, the organic compound layer 57, the organic compound layer 67, and the organic compound layer 77 can be provided by using a similar material and forming method of the insulators and the organic compound layers shown in Embodiment Mode 1. In the first insulators, the second insulators, and the third insulators, the same material may be used, and different materials may be used for each insulator.

When an insulator exists at an interface of an organic compound layer and a conductive layer, a tunnel injection of carriers between the organic compound layer and the conductive layer becomes possible. Therefore, characteristics of a writing voltage of a memory element and the like are stabilized without variation, and normal writing in each element can be performed. As shown in FIGS. 17A to 17C, when a plurality of insulators are mixed into the first conductive layers and the second conductive layers as well as into the organic compound layers, possibility of existing insulators at the interface of each of the organic compound layers and each of the first conductive layers or the interface of each of the organic compound layers and each of the second conductive layers is increased. Accordingly, a sufficient tunnel injection effect of the insulator is easily obtained. Further, since a plurality of insulators are mixed in the organic compound layer, a defect inside a layer due to crystallization of the organic compound and the like can be prevented; therefore, condition of the organic compound layer is stabilized. In addition, since a carrier injecting property is improved by the tunnel injection, a thickness of the organic compound layer can be thickened. Therefore, a defect in which a memory element is short-circuited in an initial state before having conductivity can be prevented.

Further, the first insulator 56, the first insulator 66, and the first insulator 76 existing respectively in the organic compound layer 57, the organic compound layer 67, and the organic compound layer 77 do not transport carriers. Therefore, a carrier transporting property of the entire organic compound layer 57, organic compound layer 67, and organic compound layer 77 is reduced due to obstruction of the first insulator 56, the first insulator 66, and the first insulator 76. Thus, even in an organic compound material having a high carrier transporting property, a current value that is necessary for short-circuit (writing into an element) is reduced to bring an advantage such as a low power consumption and expansion of selection range of a material.

From the above, a memory element and a semiconductor device having high reliability can be provided with high yield.

Embodiment Mode 3

In the present embodiment mode, an example of a structure of a memory element included in a memory device of the present invention will be described with drawings. More specifically, a case where a structure of a memory device is a passive matrix type will be shown.

Figure 3:
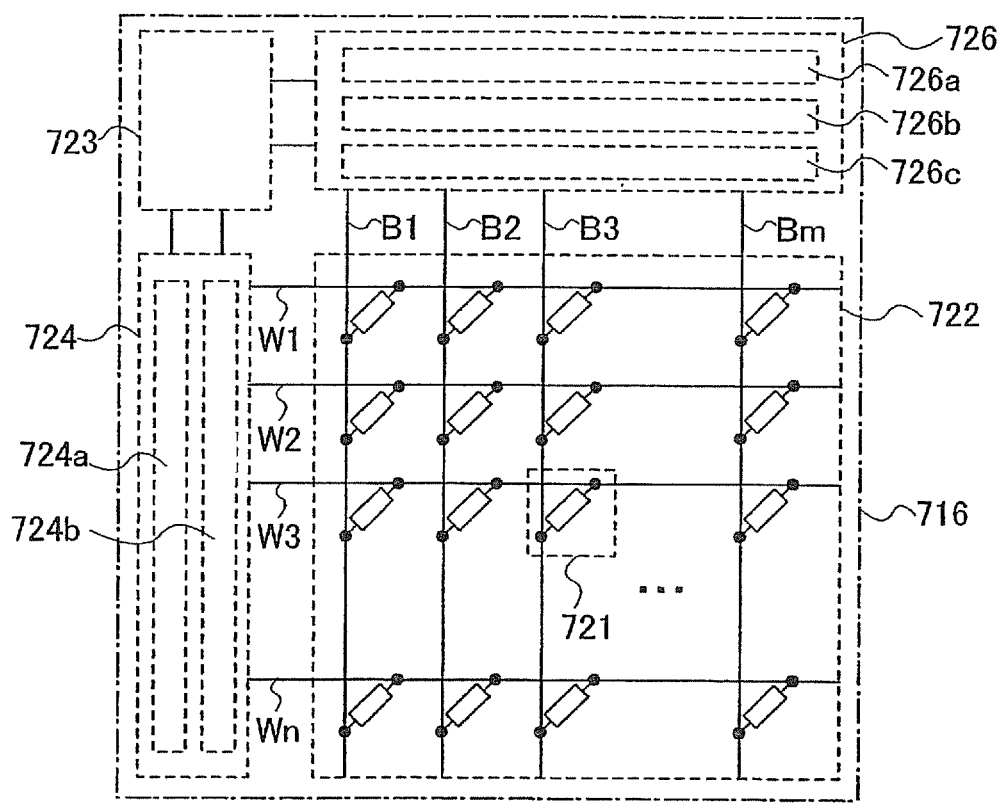
FIG. 3 is a diagram describing a memory device of the present invention.

FIG. 3 shows a configuration example of a memory device of the present invention. The memory device includes a memory cell array 722 provided with memory cells 721 in a matrix; a bit line driving circuit 726 having a column decoder 726a, a reading circuit 726b, and a selector 726c; a word line driving circuit 724 having a row decoder 724a and a level shifter 724b; and an interface 723 having a writing circuit and the like and communicating with outside. It is to be noted that a configuration of a memory device 716 shown here is only one example. The memory device 716 may include a sense amplifier, an output circuit, a buffer, and the like, and the writing circuit may be provided in the bit line driving circuit.

The memory cell 721 includes a first conductive layer forming a word line Wy ($1 \leq y \leq n$), a second conductive layer forming a bit line Bx ($1 \leq x \leq m$), and an insulting layer. The insulating layer is provided by a single layer or a stacked layer between the first conductive layer and the second conductive layer.

Figure 2A:
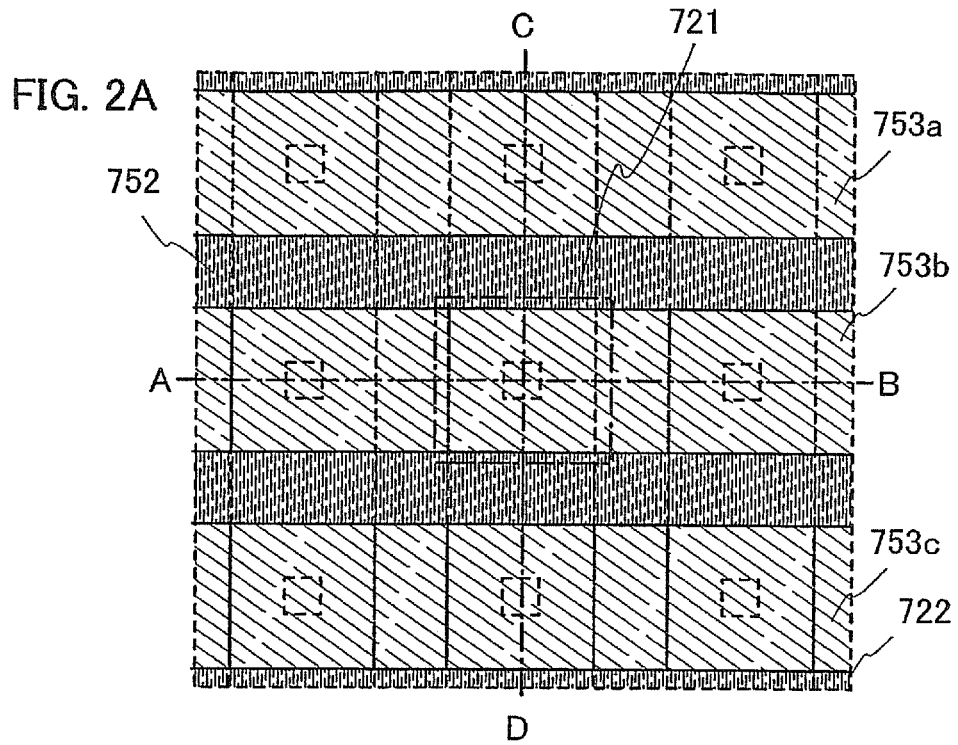
FIGS. 2A to 2C are views describing a memory device of the present invention.
Figure 2B:
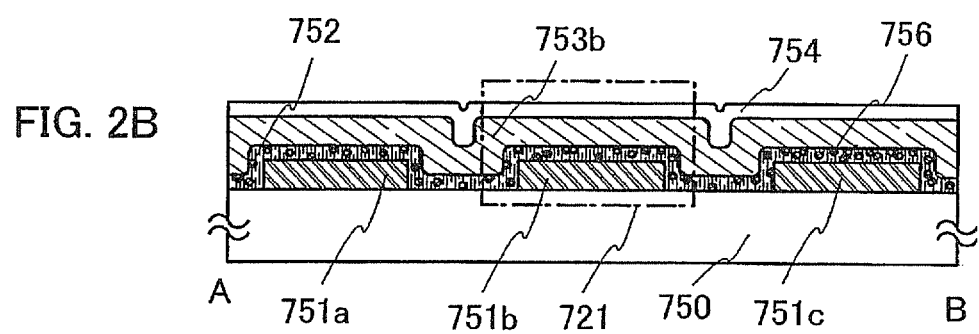
Figure 2C:
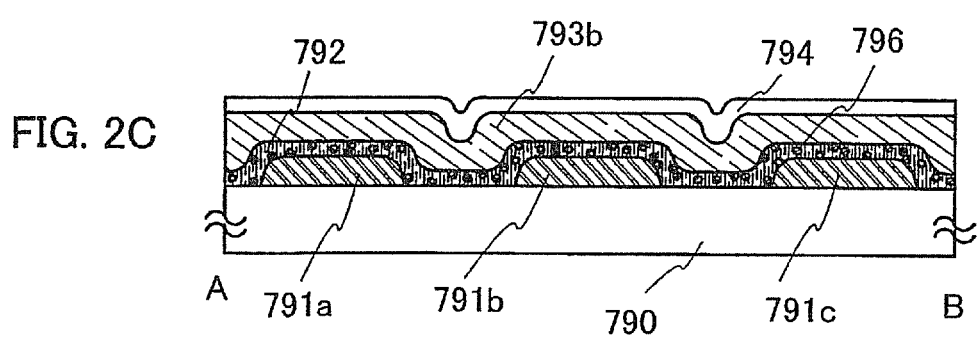

FIG. 2A shows a top view of the memory cell array 722, FIGS. 2B and 2C show cross-sectional views taken along line A-B in FIG. 2A. In FIG. 2A, an insulating layer 754 is omitted; however, the insulating layer 754 is provided as shown in FIG. 2B.

The memory cell array 722 includes a first conductive layer 751a, a first conductive layer 751b, and a first conductive layer 751c, which extend in a first direction; an organic compound layer 752 including a plurality of insulators 756 that is provide to cover the first conductive layer 751a, the first conductive layer 751b, and the first conductive layer 751c; and a second conductive layer 753a, a second conductive layer 753b, and a second conductive layer 753c, which extend in a second direction being perpendicular to the first direction (see FIG. 2A). The organic compound layer 752 including a plurality of insulators 756 is provided between the first conductive layer 751a, the first conductive layer 751b, and the first conductive layer 751c; and the second conductive layer 753a, the second conductive layer 753b, and the second conductive layer 753c. Further, the insulating layer 754 serving as a protective film is provided to cover the second conductive layer 753a, the second conductive layer 753b, and the second conductive layer 753c (see FIG. 2B). When influence of an electric field in lateral directions between each adjacent memory cell is concerned, the organic compound layer 752 including a plurality of insulators 756 that is provided in each memory cell may be isolated.

FIG. 2C is a modified example of FIG. 2B. Over a substrate 790, a first conductive layer 791a, a first conductive layer 791b, a first conductive layer 791c, an organic compound layer 792 including a plurality of insulators 796, a second conductive layer 793b, and an insulating layer 794 that is a protective film are formed. A shape of the first conductive layers may have a taper shape or a shape in which a radius of curvature is varied continuously similar to the first conductive layers 791a, 791b, and 791c in FIG. 2C. A shape such as the first conductive layers 791a, 791b, and 791c can be formed with the use of a droplet discharging method or the like. A curved surface having such a curvature provides favorable coverage of stacked insulating layers or conductive layers.

Mixed condition of the insulators in the organic compound layer of the present embodiment mode is only an example. A concentration of the insulators or the like can be arbitrarily controlled depending on a property or a size of a material used for an insulator, a material used for an organic compound and a conductive layer, and a forming method as shown in FIGS. 16A to 16C. For example, a concentration of insulators may be gradually increased toward an interface of an organic compound layer and a first conductive layer and an interface of an organic compound layer and a second conductive layer. Further, its concentration may be changed continuously or discontinuously in the organic compound layer.

Figure 8A:
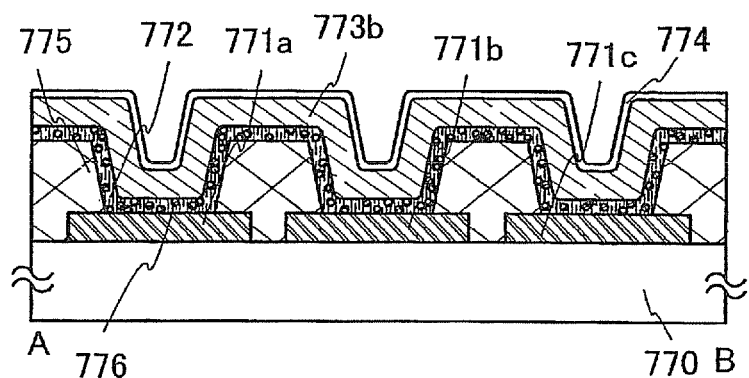
FIGS. 8A and 8B are views describing a memory device of the present invention.
Figure 8B:
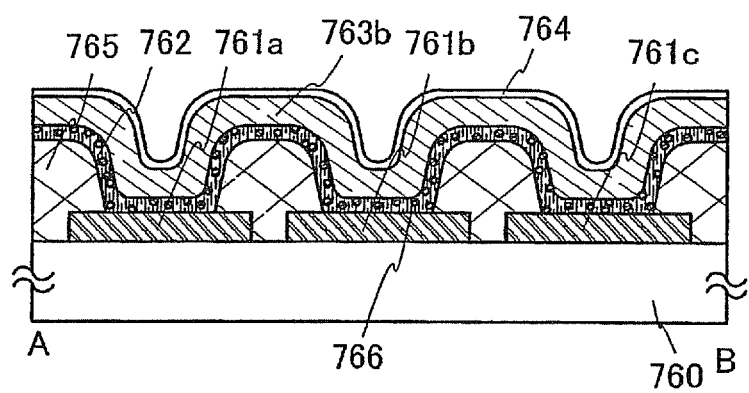

Further, a partition wall (insulating layer) may be formed to cover an edge of a first conductive layer. The partition wall (insulating layer) serves as a wall dividing between a memory element and other memory elements. FIGS. 8A and 8B show a structure in which the partition wall (insulating layer) covers the edge of the first conductive layer.

In an example of a memory element shown in FIG. 8A, a partition wall (insulating layer) 775 is formed into a shape having a taper to cover edges of a first conductive layer 771a, a first conductive layer 771b, and a first conductive layer 771c. The partition wall (insulating layer) 775 is formed over the first conductive layers 771a, 771b, and 771c provided over a substrate 770, and then, an organic compound layer 772 including a plurality of insulators 776, a second conductive layer 773b, and an insulating layer 774 are formed.

An example of a memory element shown in FIG. 8B is a shape in which a partition wall (insulating layer) 765 has a curvature, and a radius of the curvature is varied continuously. Over a substrate 760, a first conductive layer 761a, a first conductive layer 761b, a first conductive layer 761c, an organic compound layer 762 including a plurality of insulators 766, a second conductive layer 763b, and an insulating layer 764 are formed.

In the structures of the above memory cells, a quartz substrate, a silicon substrate, a metal substrate, a stainless-steel substrate, or the like, in addition to a glass substrate and a flexible substrate can be used for the substrate 750, the substrate 760, the substrate 770, and the substrate 790. The flexible substrate is a substrate that can be bent flexibly, such as a plastic substrate formed of polycarbonate, polyarylate, polyether sulfone, or the like. In addition, an attachment film (having polypropylene, polyester, vinyl, polyvinyl fluoride, polyvinyl chloride or the like), paper of a fibrous material, a base material film (polyester, polyamide, an inorganic vapor deposition film, paper, or the like), or the like can be used. Alternatively, the memory cell array 722 can be provided over a field effect transistor (FET) formed over a semiconductor substrate such as a Si substrate, or over a thin film transistor (TFT) formed over a substrate such as a glass substrate.

A material and a forming method of the first conductive layers 751a to 751c, the first conductive layers 761a to 761c, the first conductive layers 771a to 771c, the first conductive layers 791a to 791e, the second conductive layers 753a to 753c, the second conductive layers 763a to 763c, the second conductive layers 773a to 773c, and the second conductive layers 793a to 793c shown in the present embodiment mode can employ any one of the materials and the forming methods of the first conductive layer 50 and the second conductive layer 53 shown in Embodiment Mode 1 in the similar way.

Further, the insulator 756, the insulator 776, the insulator 796, the organic compound layer 752, the organic compound layer 762, the organic compound layer 772, and the organic compound layer 792 can be provided by using the similar material and forming method of the insulators and the organic compound layers shown in Embodiment Mode 1.

In addition, a rectifying element may be provided between the first conductive layers 751a to 751c and the organic compound layer 752; the first conductive layers 761a to 761c and the organic compound layer 762; the first conductive layers 771a to 771c and the organic compound layer 772; and the first conductive layers 791a to 791c and the organic compound layer 792, respectively. It is to be noted that the rectifying element may be provided between the organic compound layer 752 and the second conductive layers 753a to 753c; the organic compound layer 762 and the second conductive layers 763a to 763c; the organic compound layer 772 and the second conductive layers 773a to 773c; and the organic compound layer 792 and the second conductive layers 793a to 793c, respectively.

As the partition wall (insulating layer) 765 and the partition wall (insulating wall) 775, silicon oxide, silicon nitride, silicon oxynitride, aluminum oxide, aluminum nitride, aluminum oxynitride, or another inorganic insulating material; acrylic acid, methacrylic acid, or a derivative thereof; a heat-resistant high molecular compound such as polyimide, aromatic polyamide, or polybenzimidazole; or a siloxane material may be used. Alternatively, a resin material such as a vinyl resin of polyvinyl alcohol, polyvinylbutyral; or the like, an epoxy resin, a phenol resin, a novolac resin, an acrylic resin, a melamine resin, a urethane resin, or the like is used. Further, an organic material such as benzocyclobutene, parylene, arylether fluoride, or polyimide; a composition material containing a water-soluble homopolymer and a water-soluble copolymer; or the like may be used. As a manufacturing method, a vapor phase growth method such as a plasma CVD method or a thermal CVD method, or sputtering can be used. A droplet discharging method, a dispenser method, or a printing method (a method for forming a pattern, such as screen printing or offset printing) can also be used. A TOF film and an SOG film obtained by a coating method can also be used.

After forming a conductive layer, an insulating layer or the like by discharging a composition by a droplet discharging method, a surface thereof may be planarized by pressing with pressure to improve planarity. As a pressing method, unevenness of the surface may be reduced by moving a roller-shaped object over the surface, or the surface may be perpendicularly pressed with a flat plate-shaped object. A heating step may also be performed at the time of pressing. Alternatively, the unevenness of the surface may be eliminated with an air knife after softening or melting the surface with a solvent or the like. A CMP method may be also used for polishing the surface. This step can be employed in planarizing a surface when unevenness is generated by a droplet discharging method.

In accordance with the memory element of the present invention, characteristics of a writing voltage of the memory element and the like are stabilized without variation; therefore, normal writing in each element can be performed. Further, since a carrier injecting property is improved by a tunnel current of the insulator, a film thickness of an organic compound layer can be thickened. In addition, since a defect inside of a layer such as crystallization of an organic compound can be prevented due to a mixed layer of an insulator and an organic compound, condition of the organic compound layer is stabilized. Therefore, a defect in which the memory element is short-circuited in an initial state before having conductivity can be prevented. As a result, a memory device and a semiconductor device, each of which has high reliability, can be provided with high yield.

Embodiment Mode 4

In the present embodiment mode, a memory device having a different structure from that of Embodiment Mode 3 will be described. Specifically, the case where the structure of the memory device is an active matrix type will be shown.

Figure 5:
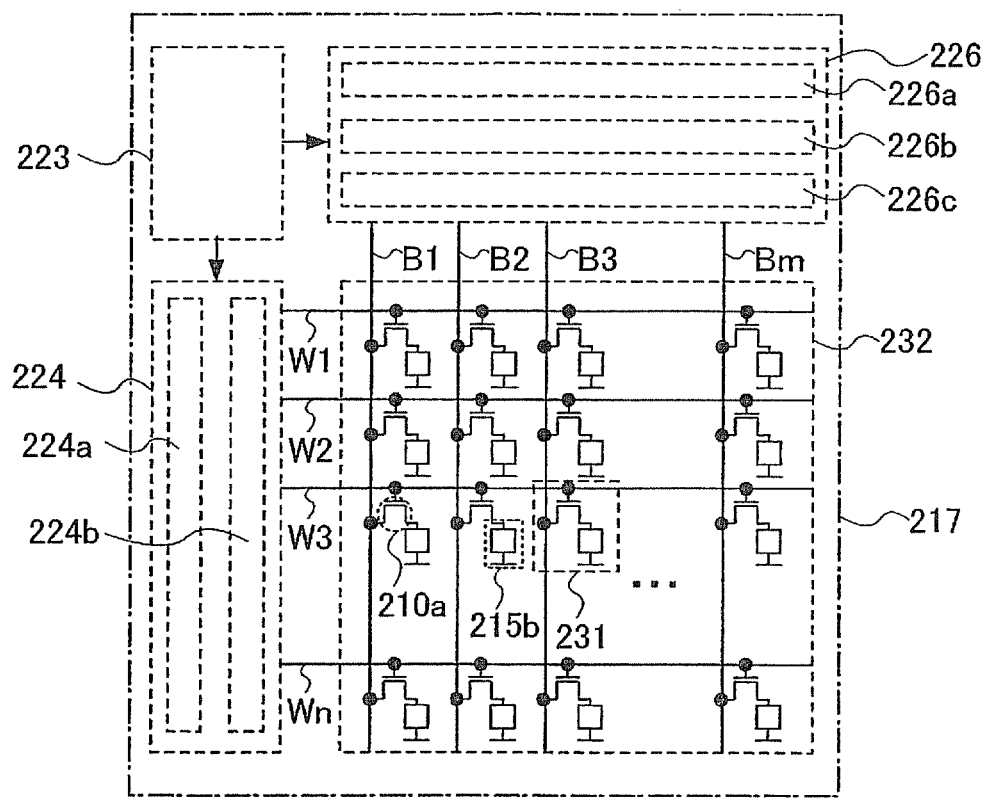
FIG. 5 is a diagram describing a memory device of the present invention.

FIG. 5 shows a configuration example of a memory device that is shown in the present embodiment mode. The memory device includes a memory cell array 232 provided with memory cells 231 in a matrix; a bit line driving circuit 226 having a column decoder 226a, a reading circuit 226b, and a selector 226c; a word line driving circuit 224 having a row decoder 224a and a level shifter 224b; and a interface 223 having a writing circuit and the like and communicating with outside. It is to be noted that a configuration of a memory device 217 shown here is only one example. The memory device 217 may include other circuits such as a sense amplifier, an output circuit, and a buffer, and the like. The writing circuit may be provided in the bit line driving circuit.

The memory cell array 232 includes a first wiring forming a word line Wy (1≤y≤n), a second wiring forming a bit line Bx (1≤x≤m), a transistor 210a, a memory element 215b, and the memory cell 231. The memory element 215b has a structure in which an organic compound layer is interposed between a pair of conductive layers.

Figure 4A:
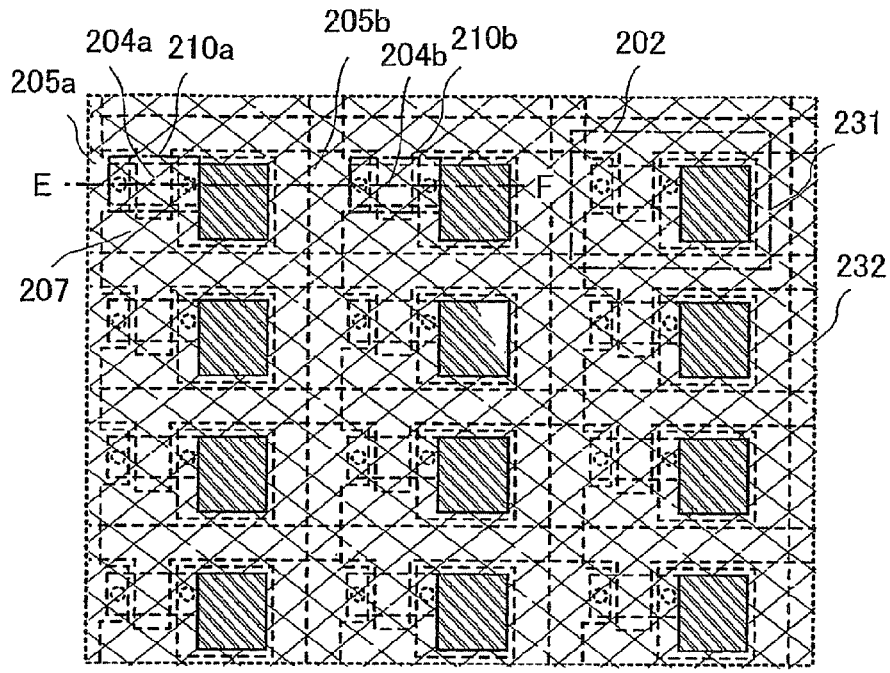
FIGS. 4A and 4B are a diagram and a view describing a memory device of the present invention.
Figure 4B:
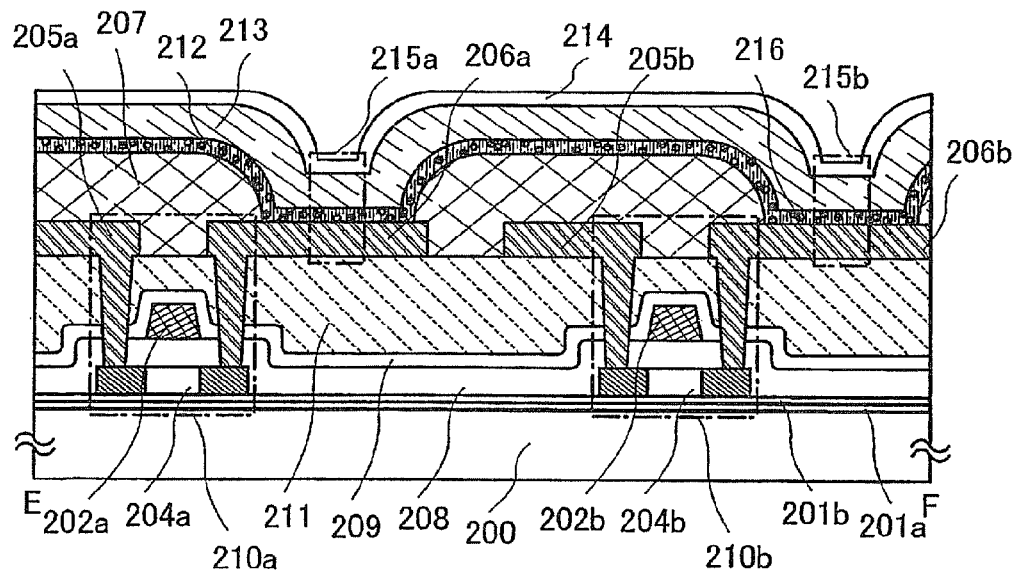

FIG. 4A shows a top view of the memory cell array 232, and FIG. 4B shows a cross-sectional view taken along a line E-F in FIG. 4A. Although an organic compound layer 212 including a plurality of insulators 216, a second conductive layer 213, and an insulating layer 214 are omitted in FIG. 4A, each of them is provided as shown in FIG. 4B.

In the memory cell array 232, a first wiring 205a and a first wiring 205b each of which are extended in a first direction, and a second wiring 202 of which is extended in a second direction that is perpendicular to the first direction, are provided in a matrix. Each of the first wirings is connected to a source electrode or a drain electrode of each transistor 210a and transistor 210b. The second wiring is connected to each gate electrode of the transistor 210a and the transistor 210b. Further, each of a first conductive layer 206a and a first conductive layer 206b is connected to a source electrode or a drain electrode of the transistors 210a and 210b, which are not connected with the first wirings. Then, an organic compound layer 212 including a plurality of insulators 216 and the second conductive layer 213 are stacked over each of the first conductive layer 206a and the first conductive layer 206b to provide a memory element 215a and a memory element 215b. Partition walls (insulating layers) 207 are provided between adjacent each memory cell 231, and the organic compound layer 212 including a plurality of insulators 216 and the second conductive layer 213 are stacked over the first conductive layers and the partition walls (insulating layers) 207. An insulating layer 214 is provided over the second conductive layer 213 as a protective layer. Further, as the transistors 210a and 210b, thin film transistors are employed (see FIG. 4B).

A memory device in FIG. 4B is provided over a substrate 200, which includes an insulating layer 201a; an insulating layer 201b; an insulating layer 208; an insulating layer 209; an insulating layer 211; a semiconductor layer 204a, a gate electrode layer 202a, and the wiring 205a serving as a source electrode or a drain electrode forming the transistor 210a; and a semiconductor layer 204b, a gate electrode layer 202b and a wiring 205b serving as a source electrode or a drain electrode forming the transistor 210b. The organic compound layer 212 including a plurality of insulators 216 and the second conductive layer 213 are formed over the first conductive layer 206a, the first conductive layer 206b, and the partition walls (insulating layers) 207. Mixed condition of the insulators in the organic compound layer of the present embodiment mode is only an example. A concentration of the insulators or the like can be arbitrarily controlled depending on a property or a size of a material used for an insulator, a material used for an organic compound and a conductive layer, and a forming method as shown in FIGS. 16A to 16C. For example, a concentration of insulators may be gradually increased toward an interface of an organic compound layer and a first conductive layer and an interface of an organic compound layer and a second conductive layer. Further, the concentration may be changed continuously or discontinuously in the organic compound layer.

In the present embodiment mode, the organic compound layer 212 including a plurality of insulators 216, which forms a memory element included in a memory device, is formed over the first conductive layer. When a voltage is applied between the first conductive layer and the second conductive layer, a current flows in the organic compound layer 212, which generates heat (Joule heat). Then, when a temperature of the organic compound layer rises to a glass-transition temperature by Joule heat, a material forming the organic compound layer 212 becomes a composition having fluidity. The composition having fluidity flows without keeping a shape of a solid state. Therefore, a film thickness of the organic compound layer is uneven, and the organic compound layer is transformed. Then, the first conductive layer and the second conductive layer are connected with each other. As a result, the first conductive layer and the second conductive layer are short-circuited. Therefore, conductivity of the memory element is changed before and after applying a voltage.

A tunnel injection of carriers from the first conductive layer to the organic compound layer 212 becomes possible due to the insulator 216 existing at an interface of the organic compound layer 212 and the first conductive layer. Therefore, characteristics of a writing voltage of the memory element and the like are stabilized without variation; therefore, normal writing in each element can be performed. Further, since a defect such as crystallization of an organic compound can be prevented due to a mixed layer of a plurality of insulators and an organic compound, condition of the organic compound layer is stabilized. In addition, since a carrier injecting property is improved by the tunnel injection, a film thickness of the organic compound layer can be thickened. Therefore, a defect in which the memory element is short-circuited in an initial state before having conductivity can be prevented.

Further, the insulator 216 existing in the organic compound layer 212 does not transport carriers. Therefore, a carrier transporting property of the entire organic compound layer 212 is reduced due to obstruction of the insulator 216. Thus, even in an organic compound material having a high carrier transporting property, a current value that is necessary for short-circuit (writing into an element) is reduced to bring an advantage such as low power consumption and expansion of selection range of a material.

Figure 6:
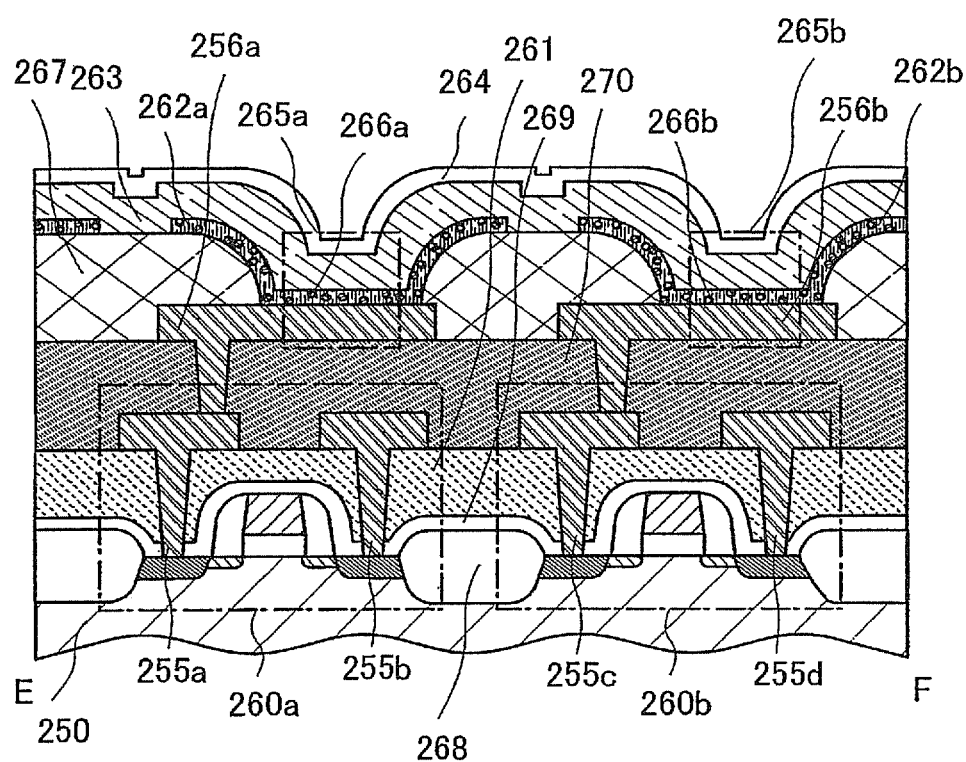
FIG. 6 is a view describing a memory device of the present invention.

As shown in FIG. 6, a memory element 265a and a memory element 265b may be connected to a field effect transistor 260a and a field effect transistor 260b provided over a single crystal semiconductor substrate 250. Here, an insulating layer 270 is provided to cover source or drain electrode layers 255a to 255d of the field effect transistor 260a and the field effect transistor 260b. Over the insulating layer 270, a first conductive layer 256a, a first conductive layer 256b, a partition wall (insulating layer) 267, an organic compound layer 262a including a plurality of insulators 266a, an organic compound layer 262b including a plurality of insulators 266b, and a second conductive layer 263 are provided to form a memory element 265a and a memory element 265b. An organic compound layer including an insulator may be selectively provided by using a mask or the like in each memory cell in the same manner as the organic compound layers 262a including a plurality of insulators 266a and the organic compound layer 262b including a plurality of insulators 266b. Further, the memory device shown in FIG. 6 also includes an element isolation region 268, an insulating layer 269, an insulating layer 261, and an insulating layer 264. The organic compound layer 262a including a plurality of insulators 266a and the organic compound layer 262b including a plurality of insulators 266b are formed over the first conductive layer 256a, the first conductive layer 256b, and the partition wall 267. A second conductive layer 263 is formed thereover. Mixed condition of the insulators in the organic compound layer of the present embodiment mode is only an example. A concentration of the insulators or the like can be arbitrarily controlled depending on a property or a size of a material used for an insulator, a material used for an organic compound and a conductive layer, and a forming method as shown in FIGS. 16A to 16C. For example, a concentration of insulators may be gradually increased toward an interface of an organic compound layer and a first conductive layer and an interface of an organic compound layer and a second conductive layer. Further, the concentration may be changed continuously or discontinuously in the organic compound layer.

In the present embodiment mode, the organic compound layer 262a including a plurality of insulators 266a and the organic compound layer 262b including a plurality of insulators 266b, which form memory elements included in a memory device, are formed over the first conductive layer. When a voltage is applied between the first conductive layer and the second conductive layer, a current flows in the organic compound layer 262a and the organic compound layer 262b, which generates heat (Joule heat). Then, when a temperature of the organic compound layer rises to a glass-transition temperature by Joule heat, a material forming the organic compound layer 262a and the organic compound layer 262b become a composition having fluidity. The composition having fluidity flows without keeping a shape of a solid state. Therefore, a film thickness of the organic compound layer is uneven, and the organic compound layer is transformed. Then, the first conductive layer and the second conductive layer are connected with each other. As a result, the first conductive layer and the second conductive layer are short-circuited. Therefore, conductivity of the memory element is changed before and after applying a voltage.

A tunnel injection of carriers from the first conductive layer to each of the organic compound layer 262a and the organic compound layer 262b becomes possible due to the insulator 266a and the insulator 266b existing at an interface of the organic compound layer 262a and the first conductive layer and at an interface of the organic compound layer 262b and the first conductive layer. Therefore, characteristics of a writing voltage of the memory element and the like are stabilized without variation; therefore, normal writing in each element can be performed. Further, since a defect such as crystallization of an organic compound can be prevented due to a mixed layer of a plurality of insulators and an organic compound, condition of the organic compound layer is stabilized. In addition, since a carrier injecting property is improved by a tunnel injection, a film thickness of the organic compound layer can be thickened. Therefore, a defect in which the memory element is short-circuited in an initial state before having conductivity can be prevented.

Further, the insulator 266a and the insulator 266b existing respectively in the organic compound layer 262a and the organic compound layer 262b do not transport carriers. Therefore, a carrier transporting property of the entire organic compound layers 262a and 262b is reduced due to obstruction of the insulator 266a and the insulator 266b. Thus, even in an organic compound material having a high carrier transporting property, a current value that is necessary for short-circuit (writing into an element) is reduced to bring an advantage such as low power consumption and expansion of selection range of a material.

As described above, the first conductive layer can be arranged freely by providing the insulating layer 270 to form a memory element. Accordingly, in the structure of FIG. 4B, the memory elements 215a and 215b are required to be provided in the regions where the source or drain electrode layers of the transistors 210a and 210b are not provided; however, for example, it is possible to form the memory elements 215a and 215b in the upper side of the transistors 210a and 210b by employing the above structure. As a result, the memory device 217 can be more highly integrated.

Furthermore, the transistor 210a and the transistor 210b can be provided in any structure as far as the transistors 210a and 210b can serve as a switching element. As a semiconductor layer, various types of semiconductors such as an amorphous semiconductor, a crystalline semiconductor, a multicrystalline semiconductor, and a microcrystalline semiconductor can be used, and an organic transistor may be formed by using an organic compound. FIG. 4A shows an example of providing a planar thin film transistor over an insulating substrate; however, a transistor can also be formed to have a staggered structure, an inverted staggered structure, or the like.

Figure 7:
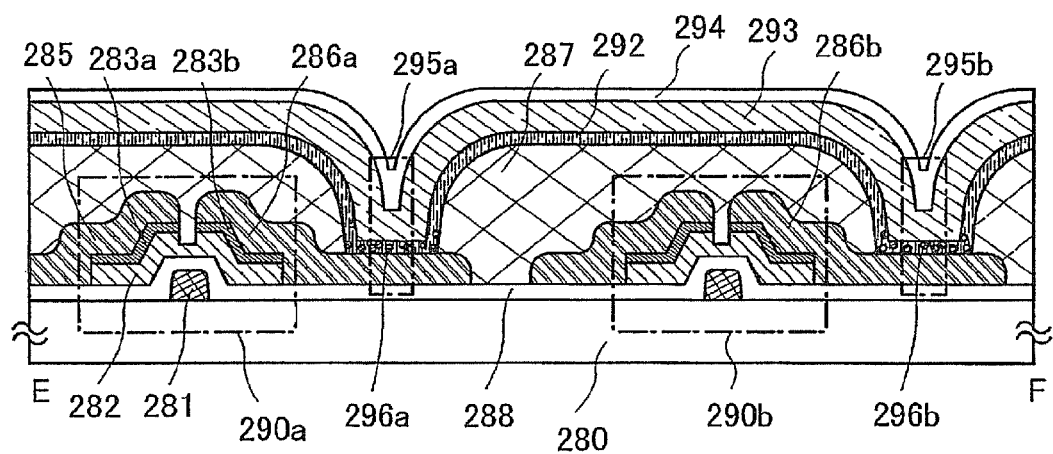
FIG. 7 is a view describing a memory device of the present invention.

FIG. 7 shows an example of using a thin film transistor having an inverted staggered structure. A transistor 290a and a transistor 290b, which are thin film transistors having an inverted staggered structure, are provided over a substrate 280. The transistor 290a includes an insulating layer 288, a gate electrode layer 281, an amorphous semiconductor layer 282, a semiconductor layer 283a having one conductivity type, a semiconductor layer 283b having one conductivity type, and a source or drain electrode layer 285. The source or drain electrode layer is a first conductive layer 286a and a first conductive layer 286b forming a memory element. A partition wall (insulating layer) 287 is stacked to cover edges of the first conductive layers 286a and 286b. An organic compound layer 292 including a plurality of insulators 296a and a plurality of insulators 296b, a second conductive layer 293, and an insulating layer 294 that is a protective layer are formed over the first conductive layers 286a and 286b and the partition wall (insulating layer) 287 to form a memory element 295a and a memory element 295b. The insulator 296a and the insulator 296b in the organic compound layer 292 are selectively added into regions of the memory element 295a and the memory element 295b, which are interposed between the first conductive layer 286a and the second conductive layer 293; and the first conductive layer 286b and the second conductive layer 293, respectively. In such a manner, the insulator may be selectively mixed into the organic compound layer. In the memory device shown in FIG. 7 of the present embodiment mode, the insulator 296a and the insulator 296b are selectively added into the organic compound layer 292 by using a doping method, an ion injecting method, or the like. Mixed condition of the insulators in the organic compound layer of the present embodiment mode is only an example. A concentration of the insulators or the like can be arbitrarily controlled depending on a property or a size of a material used for an insulator, a material used for an organic compound and a conductive layer, and a forming method as shown in FIGS. 16A to 16C. For example, a concentration of insulators may be gradually increased toward an interface of an organic compound layer and a first conductive layer and an interface of an organic compound layer and a second conductive layer. Further, the concentration may be changed continuously or discontinuously in the organic compound layer.

In the memory device shown in FIG. 7 of the present embodiment mode, the organic compound layer 292 including the insulator 296a and 296b, which forms a memory element included in the memory device, is formed over the first conductive layer. When a voltage is applied between the first conductive layer and the second conductive layer, a current flows in the organic compound layer 292, which generates heat (Joule heat). Then, when a temperature of the organic compound layer rises to a glass-transition temperature by Joule heat, a material forming the organic compound layer 292 becomes a composition having fluidity. The composition having fluidity flows without keeping a shape of a solid state. Therefore, a film thickness of the organic compound layer is uneven, and the organic compound layer is transformed. Then, the first conductive layer and the second conductive layer are connected with each other. As a result, the first conductive layer and the second conductive layer are short-circuited. Therefore, conductivity of the memory element is changed before and after applying a voltage.

A tunnel injection of carriers from the first conductive layer to the organic compound layer 292 becomes possible due to the insulator 296a and the insulator 296b each existing at an interface of the organic compound layer 292 and the first conductive layer. Therefore, characteristics of a writing voltage of the memory element and the like are stabilized without variation; therefore, normal writing in each element can be performed. Further, since a plurality of insulators are mixed in an organic compound layer, a defect such as crystallization of an organic compound can be prevented, condition of an organic compound layer is stabilized. In addition, since a carrier injecting property is improved by a tunnel injection, a film thickness of the organic compound layer can be thickened. Therefore, a defect in which the memory element is short-circuited in an initial state before having conductivity can be prevented.

Further, the insulator 296a and the insulator 296b each existing in the organic compound layer 292 do not transport carriers. Therefore, a carrier transporting property of the entire organic compound layer 292 is reduced due to obstruction of the insulator 296a and the insulator 296b. Thus, even in an organic compound material having a high carrier transporting property, a current value that is necessary for short-circuit (writing into an element) is reduced to bring an advantage such as low power consumption and expansion of selection range of a material.

In the memory device shown in FIG. 7, a gate electrode 281, the source or drain electrode layer 285, the first conductive layers 286a and 286b, and the partition wall (insulating layer) 287 are fowled by using a droplet discharging method. A droplet discharging method is a method in which a composition containing a component forming material, which is fluid, is discharged (jetted) as a droplet to form a desired pattern. A droplet containing a component forming material is discharged on a formation region of the component and solidified by baking, drying, and the like to form a component having a desired pattern.

Figure 15:
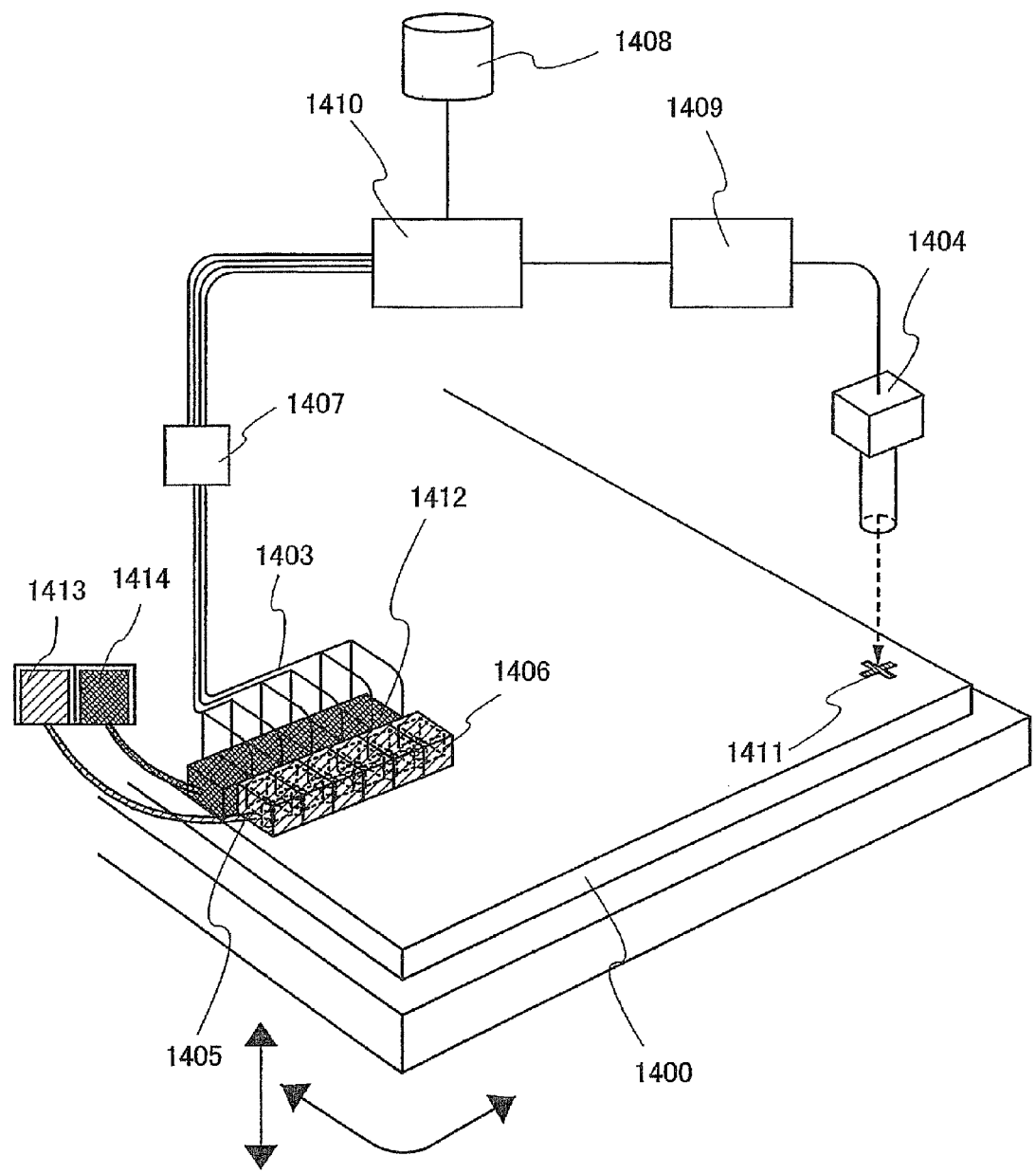
FIG. 15 is a view describing a droplet discharge device which is applicable to the present invention.

FIG. 15 shows one mode of a droplet discharge device used for a droplet discharging method. Each of heads 1405 and 1412 of a droplet discharge means 1403 is connected to a control means 1407, and this control means 1407 performs control a computer 1410 so that a preprogrammed pattern can be drawn. The drawing timing may be determined, for example, based on a marker 1411 that is formed over a substrate 1400 as a reference. Alternatively, a reference point may be fixed based on an edge of the substrate 1400 as a reference. The reference point is detected by an imaging means 1404, and then, detected data is changed into a digital signal by an image processing means 1409. Then, the digital signal is recognized by the computer 1410 to generate a control signal, and the control signal is transmitted to the control means 1407. An image sensor or the like using a charge coupled device (CCD) or a complementary metal oxide semiconductor (CMOS) can be used as the imaging means 1404. Naturally, information about a pattern to be formed over the substrate 1400 is stored in a storage medium 1408, and the control signal is transmitted to the control means 1407 based on the information, so that each of the heads 1405 and 1412 of the droplet discharge means 1403 can be individually controlled. The heads 1405 and 1412 are supplied with a material to be discharged from material supply sources 1413 and 1414 through pipes, respectively.

The head 1405 has an inside structure that has a space filled with a liquid material as shown by dotted lines 1406 and a nozzle that is a discharge opening. Although it is not illustrated, an inside structure of the head 1412 is similar to that of the head 1405. When the nozzle sizes of the heads 1405 and 1412 are different from each other, different materials with different widths can be discharged simultaneously. A conductive material, an organic material, an inorganic material, and the like can also be respectively discharged from one head to draw a pattern. In a case of drawing in a wide area such as an interlayer film, one material can be simultaneously discharged from a plurality of nozzles to improve throughput, and thus, drawing can be performed. When a large-sized substrate is used, the heads 1405 and 1412 can freely scan over the substrate in directions indicated by arrows, and a region to be drawn can be freely set. Thus, a plurality of the same patterns can be drawn over one substrate.

In a case of forming a conductive layer by a droplet discharging method, a conductive layer is formed as follows: a composition containing a particle shaped conductive material is discharged; and fusion, or welding and joining is performed by baking to solidify the composition. A conductive layer (or an insulating layer) formed by discharging and baking the composition containing the conductive material as described above tends to show a multi-crystalline state having many grain boundaries whereas a conductive layer (or an insulating layer) formed by sputtering tends to show a columnar structure.

Further, any structure may be used for a semiconductor layer included in the transistors. For example, an impurity region (including a source region, a drain region, and an LDD region) may be formed, and either a p-channel type or an n-channel type may be used. An insulating layer (sidewall) may be provided to be in contact with a side surface of the gate electrode, or a silicide layer may be formed in either or both of the source and drain regions, and the gate electrode. As a material for the silicide layer, nickel, tungsten, molybdenum, cobalt, platinum, or the like can be used.

As a material and a forming method of the first conductive layers 206a, 206b, 256a, 256b, 286a, and 286b; and the second conductive layers 213, 263, and 293 shown in the present embodiment mode, any one of the materials and the forming methods shown in Embodiment Mode 1 can be employed.

Further, the insulators 216, 266a, 266b, 296a, and 296b; and the organic compound layers 212, 262a, 262b, and 292 can be provided by using the similar material and forming method as the insulators and the organic compound layers shown in the above Embodiment Mode 1.

In addition, a rectifying element may be provided between the first conductive layers 206a and 206b and the organic compound layer 212; the first conductive layers 256a and 256b and the organic compound layers 262a and 262b, respectively; the first conductive layers 286a, and 286b and the organic compound layer 292, respectively. The rectifying element typically refers to a transistor or a diode in which a gate electrode and a drain electrode are connected. For example, a PN junction diode provided by stacking an n-type semiconductor layer and a p-type semiconductor layer can be used. In this manner, since a current flows only in one direction by providing the rectifying diode, errors are reduced and margin of reading is improved. In the case of providing a diode, not only a diode having a PN junction but also a diode having another structure such as a diode having a PIN junction or an avalanche diode may be provided. It is to be noted that the rectifying element may be provided between the organic compound layer 212 and the second conductive layer 213; the organic compound layers 262a and 262b and the second conductive layer 263; and the organic compound layer 292 and the second conductive layer 293, respectively.

In accordance with the memory element of the present invention, characteristics of a writing voltage of the memory element and the like are stabilized without variation; therefore, normal writing in each element can be performed. Further, since a carrier injecting property is improved by a tunnel current of the insulator, a film thickness of an organic compound layer can be thickened. In addition, since a defect inside of a layer such as crystallization of an organic compound can be prevented due to a mixed layer of an insulator and an organic compound, condition of the organic compound layer is stabilized. Therefore, a defect in which the memory element is short-circuited in an initial state before having conductivity can be prevented. As a result, a memory device and semiconductor device, each of which has high reliability, can be provided with high yield.

Embodiment Mode 5

In the present embodiment mode, an example of a semiconductor device that includes the memory device shown in the above embodiment mode will be described with reference to drawings.

A semiconductor device shown in the present embodiment mode is capable of reading and writing data without contact. A data transmission method is broadly classified into three of an electromagnetic coupling method of communicating by mutual induction with a pair of coils disposed in the opposed position, an electromagnetic induction method of communicating by an inductive electromagnetic field, and an electric wave method of communicating by using electric waves, and any of these methods may be employed. An antenna that is used for transmitting data can be provided in two ways. One way is to provide the antenna over a substrate provided with a plurality of elements and a memory element, and the other way is to provide a terminal portion over a substrate provided with a plurality of elements and a memory element and to connect an antenna provided over another substrate to the terminal portion.

First, an example of a structure of a semiconductor device in the case of providing an antenna over a substrate provided with a plurality of elements and a memory element will be described with reference to FIG. 10.

Figure 10:
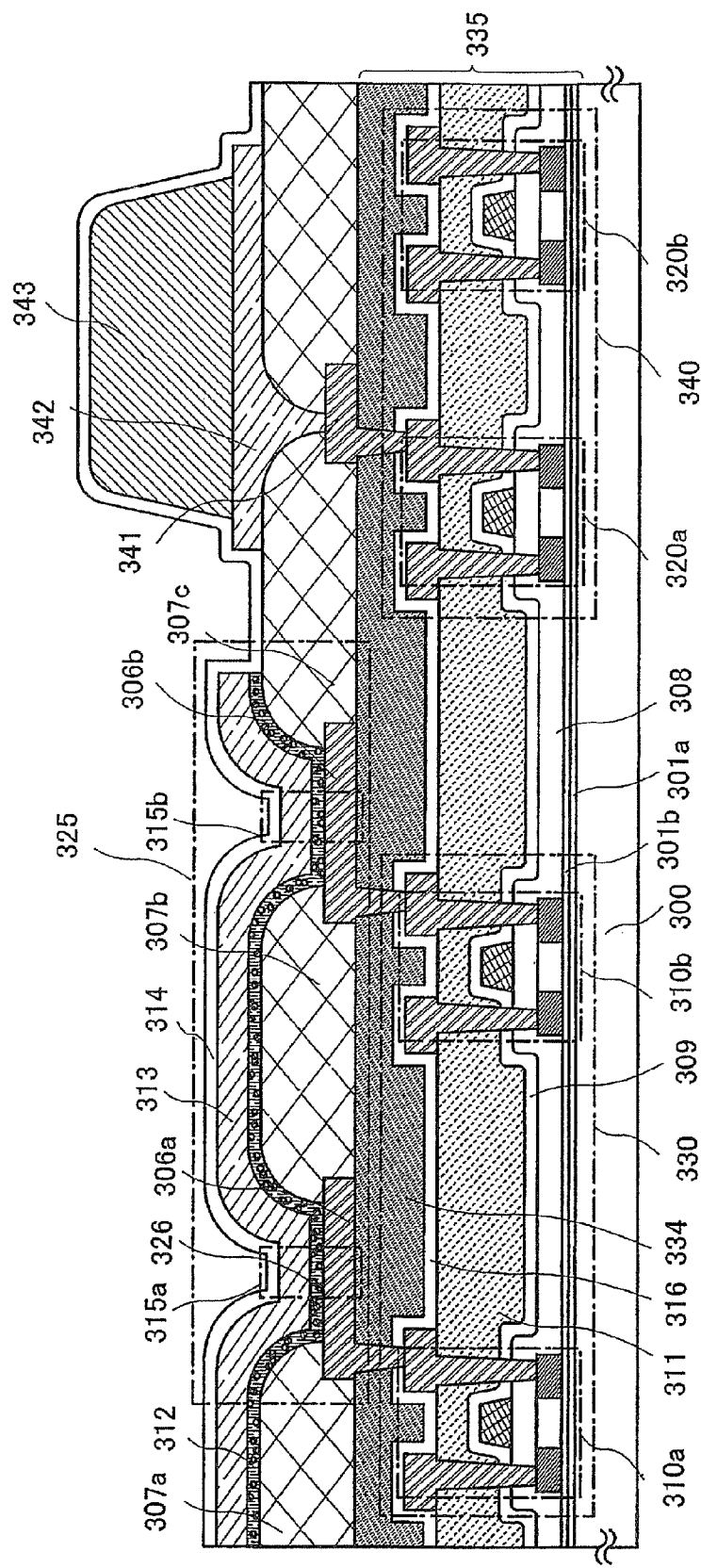
FIG. 10 is a view describing a semiconductor device of the present invention.

FIG. 10 shows a semiconductor device including a memory device that has an active matrix structure. A transistor part 330 including transistors 310a and 310b, a transistor part 340 including transistors 320a and 320b, and an element forming layer 335 including insulating layers 301a, 301b, 308, 311, 316, and 314 are provided over a substrate 300. A memory element portion 325 and a conductive layer 343 serving as an antenna are provided in the upper side of the element forming layer 335.

It is to be noted that, here, the case where the memory element portion 325 or the conductive layer 343 serving as an antenna is provided in the upper side of the element forming layer 335 is shown; however, the present invention is not limited to this structure. It is possible to provide the memory element portion 325 or the conductive layer 343 serving as an antenna in the lower side of the element forming layer 335 or in the same layer thereof.

The memory element portion 325 includes a memory element 315a and a memory element 315b. The memory element 315a is formed by stacking a partition wall (insulating layer) 307a, a partition wall (insulating layer) 307b, an organic compound layer 312 including a plurality of insulators 326, and a second conductive layer 313 over a first conductive layer 306a. The memory element 315b is provide by stacking the partition wall (insulating layer) 307b, a partition wall (insulating layer) 307c, the organic compound layer 312 including a plurality of insulators 326, and the second conductive layer 313 over a first conductive layer 306b. Further, an insulating layer 314 serving as a protective film is formed to cover the second conductive layer 313. The first conductive layers 306a and 306b where the plurality of memory elements 315a and 315b are respectively formed are connected to a source electrode layer or a drain electrode layer of the transistors 310a and 310b. In other words, each memory element is connected to one transistor. The organic compound layer 312 including a plurality of insulators 326 is formed entirely to cover the first conductive layers 306a and 306b; and the partition walls (insulating layers) 307a, 307b, and 307c. Alternatively, the organic compound layer 312 may be formed selectively in each memory cell. It is to be noted that the memory elements 315a and 315h can be formed by using the material or the forming method described in the above embodiment mode.

Mixed condition of the insulators in the organic compound layer of the present embodiment mode is only an example. A concentration of the insulators or the like can be arbitrarily controlled depending on a property or a size of a material used for an insulator, a material used for an organic compound and a conductive layer, and a forming method as shown in FIGS. 16A to 16C. For example, a concentration of insulators may be gradually increased toward an interface of an organic compound layer and a first conductive layer and an interface of an organic compound layer and a second conductive layer. Further, the concentration may be changed continuously or discontinuously in the organic compound layer.

In a memory device shown in FIG. 10 of the present embodiment mode, the organic compound layer 312 including the insulator 326, which forms a memory element included in the memory device, is formed over the first conductive layer. When a voltage is applied between the first conductive layer and the second conductive layer, a current flows in the organic compound layer 312, which generates heat (Joule heat). Then, when a temperature of the organic compound layer rises to a glass-transition temperature by Joule heat, a material forming the organic compound layer 312 becomes a composition having fluidity. The composition having fluidity flows without keeping a shape of a solid state. Therefore, a film thickness of the organic compound layer is uneven, and the organic compound layer is transformed. Then, the first conductive layer and the second conductive layer are connected to each other. As a result, the first conductive layer and the second conductive layer are short-circuited. Therefore, conductivity of the memory element is changed before and after applying a voltage.

A tunnel injection of carriers from the first conductive layer to the organic compound layer 312 becomes possible due to the insulator 326 existing at an interface of the organic compound layer 312 and the first conductive layer. Therefore, characteristics of a writing voltage of the memory element and the like are stabilized without variation; therefore, normal writing in each element can be performed. Further, since a plurality of insulators are mixed in an organic compound layer, a defect such as crystallization of an organic compound can be prevented, condition of an organic compound layer is stabilized. In addition, since a carrier injecting property is improved by the tunnel injection, a film thickness of the organic compound layer can be thickened. Therefore, a defect in which the memory element is short-circuited in an initial state before having conductivity can be prevented.

Further, the insulator 326 existing in the organic compound layer 312 does not transport carriers. Therefore, a carrier transporting property of the entire organic compound layer 312 is reduced due to obstruction of the insulator 326. Thus, even in an organic compound material having a high carrier transporting property, a current value that is necessary for short-circuit (writing into an element) is reduced to bring an advantage such as low power consumption and expansion of selection range of a material.

In addition, in the memory element 315a, a rectifying element may be provided between the first conductive layer 306a and the organic compound layer 312 including the insulator 326, or between the organic compound layer 312 including the insulator 326 and the second conductive layer 313 as shown in the above embodiment mode. It is possible that the rectifying element described above is used. It is to be noted that it is also employed in the memory element 315b.

Here, the conductive layer 343 serving as an antenna is provided over a conductive layer 342 that is formed of the same layer with the second conductive layer 313. It is to be noted that a conductive layer serving as an antenna may be formed of the same layer with the second conductive layer 313.

As a material of the conductive layer 343 serving as an antenna, an element selected from gold (Au), platinum (Pt), nickel (Ni), tungsten (W), molybdenum (Mo), cobalt (Co), copper (Cu), aluminum (Al), manganese (Mn), and titanium (Ti) or an alloy containing a plurality of the elements can be used. Further, an evaporation method, sputtering, a CVD method, a dispenser method, any printing method such as gravure printing or screen printing, a droplet discharging method, or the like can be used to form the conductive layer 343 serving as an antenna.

Each of the transistors 310a, 310b, 310c, and 310d included in the element forming layer 335 can be provided by a p-channel TFT or an n-channel TFT, or a CMOS circuit combining a p-channel TFT and an n-channel TFT. Further, any structure may be used for a semiconductor layer included in the transistors 310a, 310b, 310c, and 310d. For example, an impurity region (including a source region, a drain region, and an LDD region) may be formed, and either a p-channel type or an n-channel type may be employed. An insulating layer (sidewall) may be formed to be in contact with a side face of the gate electrode, or a silicide layer may be formed for either or both of source and drain regions and the gate electrode. As a material for the silicide layer, nickel, tungsten, molybdenum, cobalt, platinum, or the like can be used.

Each of the transistors 310a, 310b, 310c, and 310d included in the element forming layer 335 may be provided using an organic transistor in which a semiconductor layer forming the transistors is formed of an organic compound. In this case, the element forming layer 335 including the organic transistor can be formed by using a direct printing method, a droplet discharging method, or the like over the substrate 300 that is a flexible substrate such as a plastic substrate. By using a printing method, a droplet discharging method, or the like, a semiconductor device can be manufactured at low cost.

Further, the element forming layer 335, the memory elements 315a, and 315b, and the conductive layer 343 serving as an antenna can be formed by an evaporation method, sputtering, a CVD method, a dispenser method, a droplet discharging method or the like as described above. It is to be noted that different methods may be employed to form different parts. For example, in order to obtain a transistor requiring high-speed operation, a semiconductor layer formed of Si or the like is provided over a substrate and crystallized by a heat treatment, and then, a transistor serving as a switching element can be provided as an organic transistor in the upper side of a element forming layer by using a printing method or a droplet discharging method.

It is to be noted that a sensor connecting to the transistor may be provided. As the sensor, an element for detecting properties such as temperature, humidity, illuminance, gas, gravity, pressure, sound (vibration), and acceleration by a physical means or a chemical means can be given. The sensor can be formed by a semiconductor element such as a resistance element, a capacitive coupling element, an inductive coupling element, a photovoltaic element, a photoelectric conversion element, a thermoelectromotive force element, a transistor, a thermistor, or a diode.

Next, an example of a structure of a semiconductor device will be described with reference to FIG. 11, in the case where the semiconductor device is provided by providing a terminal portion over a substrate provided with a plurality of elements and a memory element to connect with an antenna provided over another substrate.

Figure 11:
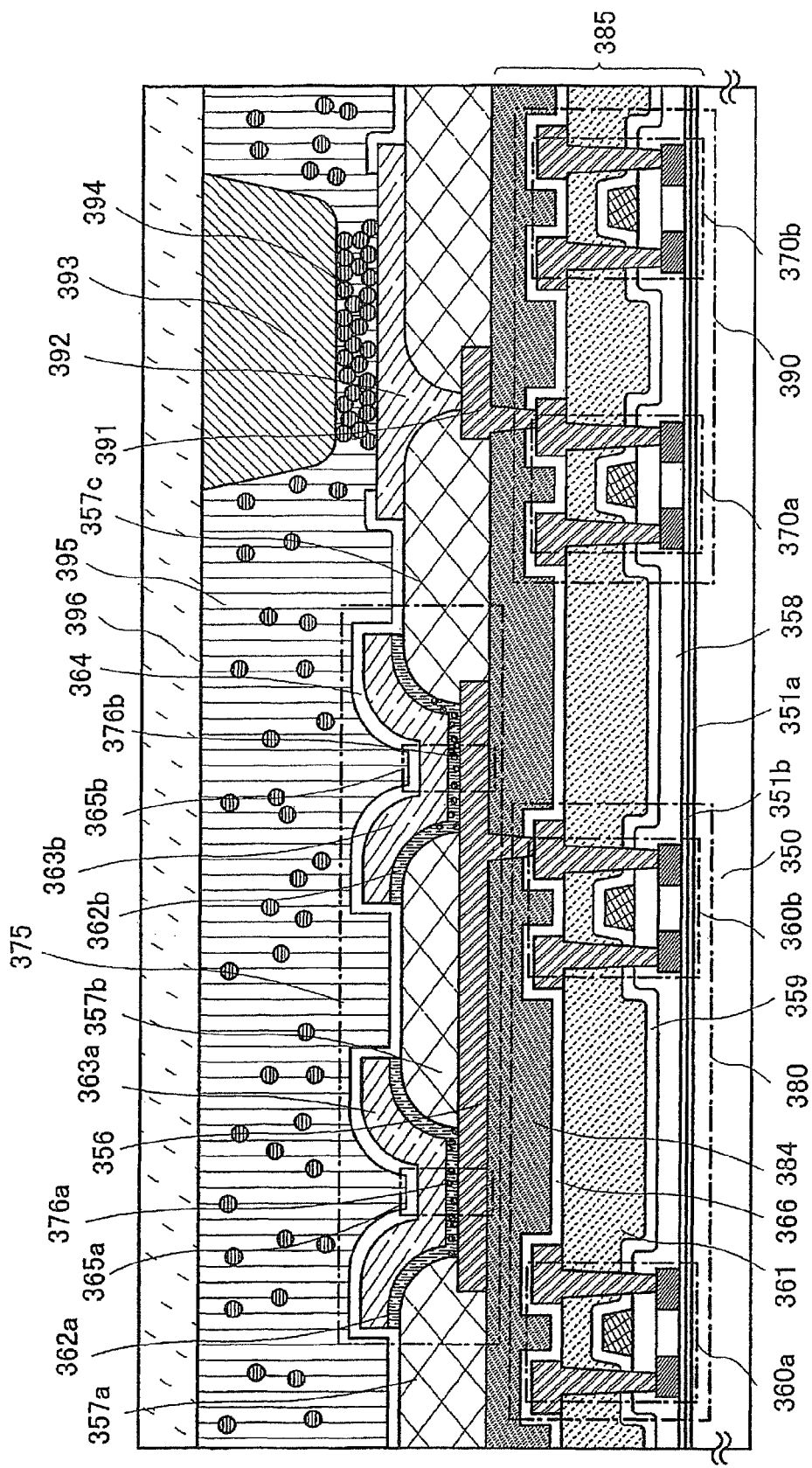
FIG. 11 is a view describing a semiconductor device of the present invention.

FIG. 11 shows a semiconductor device including a memory device that has a passive matrix structure. An element forming layer 385 is provided over a substrate 350, and a memory element portion 375 is provided over the element forming layer 385. A conductive layer 393 serving as an antenna is provided over a substrate 396 to connect to the element forming layer 385. Here, the case where the memory element portion 375 or the conductive layer 393 serving as an antenna is provide in the upper side of the element forming layer 385, is shown; however, the present invention is not limited to this structure. It is possible that the memory element portion 375 is provided in the lower side of the element forming layer 385 or in the same layer thereof. Alternatively, it is also possible that the conductive layer 393 serving as an antenna is provided in the lower side of the element forming layer 385.

The memory element portion 375 includes memory elements 365a and 365b. The memory element 365a is formed by stacking a partition wall (insulating layer) 375a, a partition wall (insulating layer) 375b, an organic compound layer 362a including a plurality of insulators 376a, and a second conductive layer 363a over a first conductive layer 356. The memory element 365b is formed by stacking the partition wall (insulating layer) 357b, a partition wall (insulating layer) 357c, an organic compound layer 362b including a plurality of insulators 376b, and a second conductive layer 363b over the first conductive layer 356. Further, an insulating layer 364 serving as a protective film is formed to cover the second conductive layers 363a and 363b. In addition, the first conductive layer 356 where a plurality of memory elements 365a and 365b are formed is connected to a source electrode layer or a drain electrode layer of the only transistor 360b. In other words, the memory elements are connected to the one same transistor. The organic compound layer 362a including the insulator 376a and the organic compound layer 362b including the insulator 376b provide the partition walls (insulating layers)

357a, 357b, and 357c between each memory cell to isolate the insulating layers. However, when influence of electric field in lateral directions between each adjacent memory cell is not concerned, the organic compound layers 362a and 362b may be formed over the entire surface of the first conductive layer 356. It is to be noted that the memory elements 365a and 365b can be formed by using the material and the manufacturing method shown in the above embodiment mode.

Mixed condition of the insulator in the organic compound layer of the present embodiment mode is only an example. A concentration of the insulator or the like can be arbitrarily controlled depending on a property or a size of a material used for an insulator, a material used for an organic compound and a conductive layer, and a forming method as shown in FIGS. 16A to 16C. For example, a concentration of insulators may be gradually increased toward an interface of an organic compound layer and a first conductive layer and an interface of an organic compound layer and a second conductive layer. Further, the concentration may be changed continuously or discontinuously in the organic compound layer.

In the memory device shown in FIG. 11 of the present embodiment mode, the organic compound layer 362a including the insulator 376a and the organic compound layer 362b including the insulator 376b, which form a memory element included in the memory device, is formed over the first conductive layer. When a voltage is applied between the first conductive layer and the second conductive layer, a current flows in the organic compound layer 362a and the organic compound layer 362b, which generates heat (Joule heat). Then, when a temperature of the organic compound layer rises to a glass-transition temperature by Joule heat, a material forming the organic compound layer 362a and the organic compound layer 362b becomes a composition having fluidity. The composition having fluidity flows without keeping a shape of a solid state. Therefore, a film thickness of the organic compound layer is uneven, and the organic compound layer is transformed. Then, the first conductive layer and the second conductive layer are connected with each other. As a result, the first conductive layer and the second conductive layer are short-circuited. Therefore, conductivity of the memory element is changed before and after applying a voltage.

A tunnel injection of carriers from the first conductive layer to the organic compound layer 362a and the organic compound layer 362b becomes possible due to the insulator 376a and the insulator 376b each existing at an interface of the organic compound layer 362a and the first conductive layer and an interface of the organic compound layer 362b and the first conductive layer. Therefore, characteristics of a writing voltage of the memory element and the like are stabilized without variation; therefore, normal writing in each element can be performed. Further, since a plurality of insulators are mixed in an organic compound layer, a defect inside of a layer such as crystallization of an organic compound can be prevented from generating, and condition of an organic compound layer is stabilized. In addition, since a carrier injecting property is improved by the tunnel injection, a film thickness of the organic compound layer can be thickened. Therefore, a defect in which the memory element is short-circuited in an initial state before having conductivity can be prevented.

Further, the insulator 376a and the insulator 376b each existing in the organic compound layer 362a and the organic compound layer 362b does not transport carriers. Therefore, a carrier transporting property of the entire organic compound layers 362a and 362b is reduced due to obstruction of the insulators 376a and 376b. Thus, even in an organic compound material having a high carrier transporting property, a current value that is necessary for short-circuit (writing into an element) is reduced to bring an advantage such as low power consumption and expansion of selection range of a material.

The substrate including the element forming layer 385 and the memory element portion 375 is attached to the substrate 396 provided with the conductive layer 393 serving as an antenna with an adhesive resin 395. The element forming layer 385 and the conductive layer 393 are electrically connected to each other through conductive fine particles 394 contained in the resin 395. Alternatively, the substrate including the element forming layer 385 and the memory element portion 375 may be attached to the substrate 396 provided with the conductive layer 393 serving as an antenna with a conductive adhesive such as silver paste, copper paste, or carbon paste, or by solder bonding.

Thus, a semiconductor device provided with a memory device and an antenna can be formed. In addition, in the present embodiment mode, an element forming layer can be provided by forming a thin film transistor over a substrate. Alternatively, a semiconductor substrate such as a Si substrate is used as a substrate, and an element forming layer may be provided by forming a filed effect transistor over the substrate. Furthermore, an SOI substrate may be used as a substrate and an element forming layer may be provided thereover. In this case, the SOI substrate may be formed by attaching wafers or by using a method called SIMOX in which an insulating layer is formed inside a substrate by implanting oxygen ions into a Si substrate.

In addition, a memory element portion may be provided over a substrate provided with a conductive layer serving as an antenna. Further, a sensor connecting to a transistor may be provided.

It is to be noted that the present embodiment mode can be freely combined with the above embodiment modes. Further, the semiconductor device manufactured in the present embodiment mode is separated from the substrate by a separation process and is attached to a flexible substrate to be provided over a flexible substratum. Then, a semiconductor device having flexibility can be obtained. The flexible substratum corresponds to a film made of polypropylene, polyester, vinyl, polyvinyl fluoride, polyvinyl chloride, or the like, paper made from a fibrous material, a stacked film of a base film (polyester, polyamide, an inorganic vapor deposition film, paper, or the like) and an adhesive synthetic resin film (an acrylic-based synthetic resin, an epoxy-based synthetic resin, or the like), or the like. The films are subjected to a heat treatment and a pressure treatment by thermocompression bonding. An adhesive layer that is provided on the outermost surface of the layer, or a layer (not an adhesive layer) that is provided on the outermost layer thereof, is melted by a heart treatment, and then is pressured, so that the films are attached. An adhesive layer may be provided on the substratum or it may not be provided. The adhesive layer corresponds to a layer containing an adhesive such as a heat curable resin, an ultraviolet-curable resin, an epoxy resin-based adhesive, or a resin additive.

In accordance with the memory element of the present invention, characteristics of a writing voltage of the memory element and the like are stabilized without variation; therefore, normal writing in each element can be performed. Further, since a carrier injecting property is improved by a tunnel current of a mixed layer of an inorganic insulator and an organic compound, a film thickness of an organic compound layer can be thickened. Therefore, a defect in which the memory element is short-circuited in an initial state before having conductivity can be prevented. As a result, a memory device and a semiconductor device, each of which has high reliability, can be provided with high yield.

Embodiment Mode 6

In the present embodiment, reading or writing date into the semiconductor device having the above structure will be described.

Writing data into the semiconductor device having the above structure can be performed by adding electric action. The case of writing data by adding electric action will be described (FIG. 3).

When writing data is performed by adding electric action, one of memory cells 721 is selected by a row decoder 724a, a column decoder 726a, and a selector 726c, and then, data is written into the memory cell 721 with the use of a writing circuit. Specifically, a large voltage is selectively applied to an organic compound layer 752 in a desired portion, and a large amount of current is fed so that short-circuit is caused between a first conductive layer 751b and a second conductive layer 753b.

Electric resistance of the short-circuited portion is largely decreased compared to that of the other portions. Thus, by adding the electric action, writing data is performed by utilizing a change in the electric resistance between the two conductive layers. For example, in the case where an organic compound layer to which the electric action is not added, is used as data "0", when writing data "1", a large voltage is selectively applied to the organic compound layer in a desired portion, and a large amount of current is fed to cause short-circuit and to decrease the electric resistance.

Figure 9:
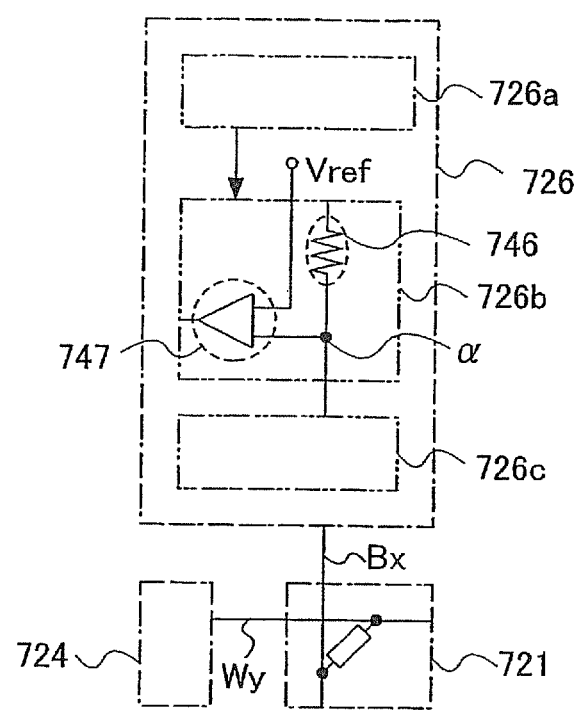
FIG. 9 is a diagram describing a memory device of the present invention.

Subsequently, operation in the case of reading data from a memory element will be described (see FIG. 9). Here, a reading circuit 726b includes a resistance element 746 and a sense amplifier 747. However, the reading circuit 726b is not limited to the above structure, and the reading circuit may have any structure.

Reading data is performed by applying a voltage between the first conductive layer 751b and the second conductive layer 753b to a read electric resistance value of an organic compound layer 752. For example, in the case of writing the data by applying electric action as described above, a resistance value Ra1 in the case where the electric action is not added, and a resistance value Rb1 in the case where the electric value is added so that short-circuit is caused between the two conductive layers, fulfill Ra1>Rb1. Reading data is performed by electrically reading such a difference in the resistance value.

For example, data of the memory cell 721 disposed in an x-th column and a y-th row is read among a plurality of the memory cells 721 included in a memory cell array 722. In that case, first, a bit line Bx in the x-th column and a word line Wy in the y-th row are selected by the row decoder 724a, the column decoder 726a, and the selector 726c. Then, an organic compound layer included in the memory cell 721 and a resistance element 746 are in such a state that they are connected in series. Thus, a voltage is applied to the opposite edges of the two connected resistance elements in series, electric potential of a node α becomes resistance-divided electric potential in accordance with the resistance value Ra or Rb of the organic compound layer 752. The electric potential of the node α is supplied to a sense amplifier 747. In the sense amplifier 747, which of the information "0" and "1" is contained is judged. After that, a signal containing the information "0" or "1" judged by the sense amplifier 747 is supplied to the outside.

In accordance with the above method, the state of the electric resistance in the organic compound layer is read by a voltage value utilizing the difference in the resistance value and the resistance division. However, a method in which current values are compared may be employed. This method, for example, utilizes that a current value Ia1 in the case where the electric action is not added to the organic compound layer, and a resistance value Ib1 in the case where the electric action is added to the organic compound layer so that short-circuit is caused between the two conductive layers, fulfill Ia1<Ib1. Thus, reading data may be performed by electrically reading such a difference in the current value.

Since a memory element having the above structure and a semiconductor device provided with the memory element are nonvolatile memories, an electric battery for storing data is not required to be mounted. A small-sized, thin, and light-weight semiconductor device can be provided. Further, by using the insulating material that is used in the above embodiment mode as an organic compound layer, rewriting data cannot be performed though writing data (additionally) is possible. Accordingly, counterfeits can be prevented and a semiconductor device with ensured security can be provided.

It is to be noted that a memory element having a passive matrix structure of which a memory circuit is a simple and semiconductor device provided with the memory element have been taken as examples in the present embodiment mode. However, even in the case of using a memory circuit having an active matrix structure, data can be written or read in a similar manner.

Here, in the case of an active matrix structure, a specific example of reading data in a memory element by electric action will be described with reference to FIGS. 14A and 14B.

Figure 14A:
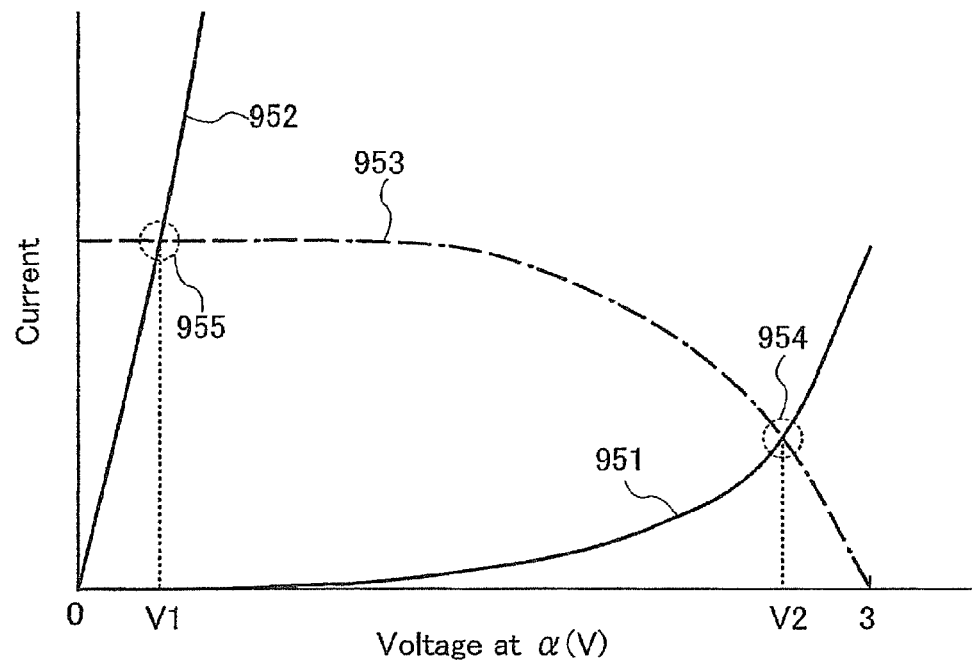
FIGS. 14A and 14B are a graph and a diagram describing a memory element of the present invention.
Figure 14B:
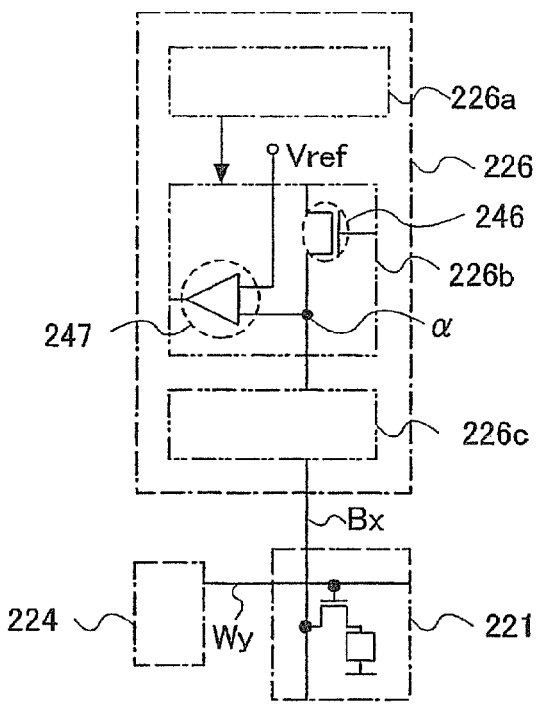

FIGS. 14A and 14B show current-voltage characteristics 951 of a memory element portion in which data "0" is written, current-voltage characteristics 952 a memory element portion of in which data "1" is written, and current-voltage characteristics 953 of a resistance element 246. Here, the case of using a transistor as the resistance element 246 is shown. In addition, the case of applying 3 V between a first conductive layer 243 and a second conductive layer 245 as a operation voltage in reading data will be described.

In FIGS. 14A and 14B, as for a memory cell having a memory element portion in which data "0" is written, an intersection point 954 of the current-voltage characteristics 951 of the memory element portion and the current-voltage characteristics 953 of the transistor is an operational point, and potential of a node α at this time is V1 (V). The potential of the node α is supplied to a sense amplifier 247. The data stored in the memory cell is recognized as "0" in the sense amplifier 247.

Meanwhile, as for a memory cell having a memory element portion in which data "1" is written, an intersection point 955 of the current-voltage characteristics a memory element portion 952 of and the current-voltage characteristics 953 of the transistor is an operational point, and potential of a node α at this time is V2 (V) (V1>V2). The potential of the node α is supplied to the sense amplifier 247. The data stored in the memory cell is recognized as "1" in the sense amplifier 247.

Thus, the data stored in the memory cell can be distinguished by reading the potential divided by resistance in accordance with the resistance value of a memory element portion 241.

It is to be noted that the present embodiment mode can be freely combined with any structures of the memory element and the semiconductor device provided with the memory element shown in the above embodiment modes.

Embodiment Mode 7

Figure 12A:
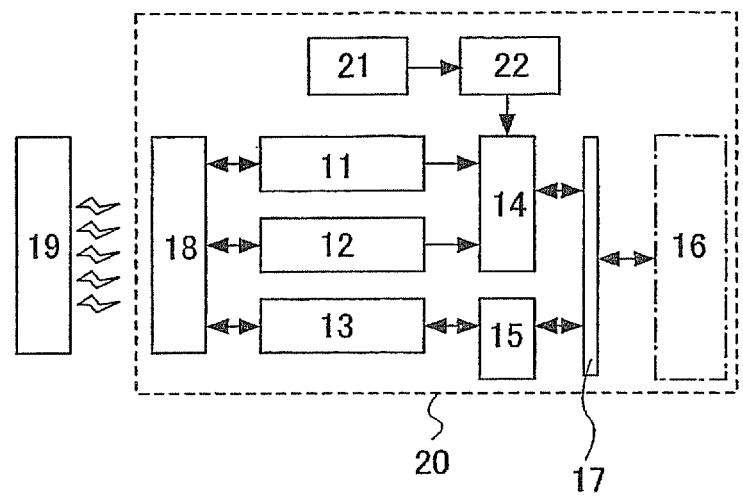
FIGS. 12A and 12B are views describing a semiconductor device of the present invention.

A structure of a semiconductor device of the present embodiment mode will be described with reference to FIG. 12A. As shown in FIG. 12A, a semiconductor device 20 of the present invention has a function of communicating data without contact, and includes a power supply circuit 11, a clock generation circuit 12, a data demodulation/modulation circuit 13, a control circuit 14 for controlling other circuits, an interface circuit 15, a memory circuit 16, a data bus 17, an antenna (antenna coil) 18, a sensor 21, and a sensor circuit 22.

In the power supply circuit 11, various kinds of power supplies, which are supplied to each circuit in the semiconductor device 20, are generated in accordance with an alternating current signal inputted from the antenna 18. In the clock generation circuit 12, various kinds of clock signals, which are supplied to each circuit in the semiconductor device 20, are generated in accordance with an alternative current signal inputted from the antenna 18. The data demodulation/modulation circuit 13 has a function of demodulating/modulating data communicated with a reader/writer 19. The control circuit 14 has a function of controlling the memory circuit 16. The antenna 18 has a function of transmitting/receiving electromagnetic fields or electric waves. The reader/writer 19 communicates with the semiconductor device, and controls a process with regard to the data of the semiconductor device. It is to be noted that the structure of the semiconductor device is not limited to the above structure, and, for example, other elements such as a limiter circuit of a power supply voltage and hard ware dedicated to encryption may be additionally provided.

The memory circuit 16 has a memory element where an organic compound layer or a phase change layer is interposed between a pair of conductive layers. It is to be noted that the memory circuit 16 may have only the memory element where an organic compound layer or a phase change layer is interposed between a pair of conductive layers, or may have another memory circuit with a different structure. The memory circuit with a different structure corresponds, for example, to one or more selected from a DRAM, an SRAM, an FeRAM, a mask ROM, a PROM, an EPROM, an EEPROM, and a flash memory.

The sensor 21 is formed using a semiconductor element such as a resistance element, a capacitive coupling element, an inductive coupling element, a photovoltaic element, a photoelectric conversion element, a thermal electromotive force element, a transistor, a thermistor, and a diode. The sensor circuit 22 detects changes in impedance, reactance, inductance, a voltage, or a current, and performs analog/digital (A/D) conversion to output a signal to the control circuit 14.

Embodiment Mode 8

In accordance with the present invention, a semiconductor device serving as a processor chip (also referred to as a wireless chip, a wireless processor, a wireless memory, and a wireless tag) can be formed. The usage of the semiconductor device of the present invention is wide-ranging. For example, the semiconductor device can be used by being provided on paper money, coin, securities, certificates, bearer bonds, packing containers, documents, recording medium, personal belongings, vehicles, foods, garments, health articles, livingwares, medicines, electronic apparatuses, and the like.

Figure 13A:
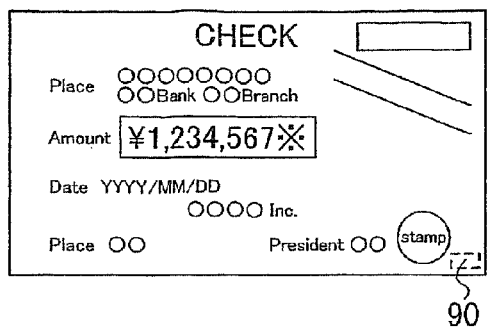
FIGS. 13A to 13G are views describing application examples of semiconductor devices of the present invention.
Figure 13B:
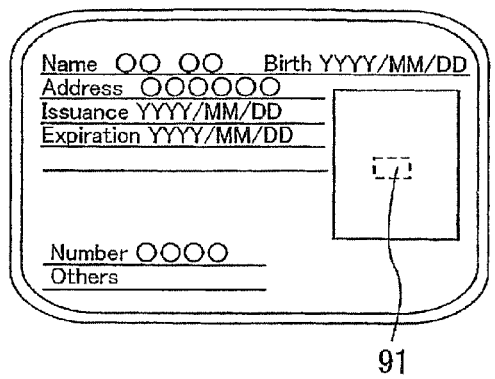
Figure 13C:
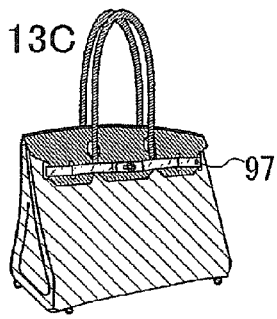
Figure 13D:
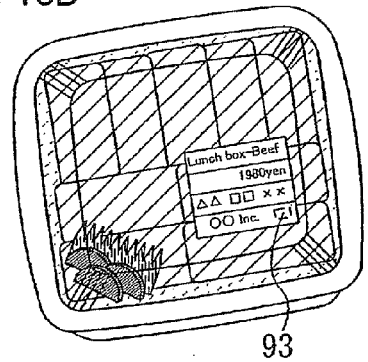
Figure 13E:
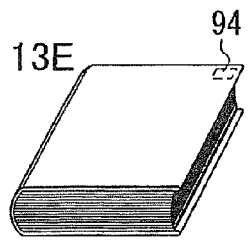
Figure 13F:
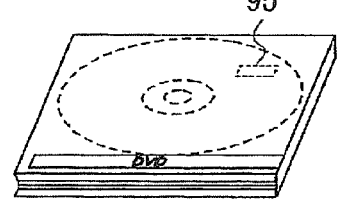
Figure 13G:
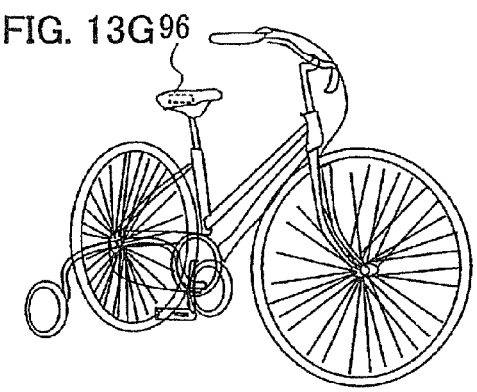

The paper money and coins are money distributed in the market and include currency (cash vouchers) available in a certain area in a similar way to money, and memorial coins and the like. The securities refer to checks, stock certificates, promissory notes, and the like, which can be provided with a processor chip 90 (see FIG. 13A). The certificates refer to driver's licenses, certificates of residence, and the like, which can be provided with a processor chip 91 (see FIG. 13B). The personal belongings refer to a bag, a pair of glasses, and the like, which can be provided with a processor chip 97 (see FIG. 13C). The bearer bonds refer to stamps, rice coupons, various merchandise coupons, and the like. The packing containers refer to wrapping paper for a box lunch, plastic bottles, and the like, which can be provided with a processor chip 93 (see FIG. 13D). The documents refer to volumes, books and the like, which can be provided with a processor chip 94 (see FIG. 13E). The recording medium refer to DVD software, video tapes, and the like, which can be provided with a processor chip 95 (see FIG. 13F). The vehicles refer to wheeled vehicles such as bicycles, vessels, and the like, which can be provided with a processor chip 96 (FIG. 13G). The foods refer to eatables, drinks, and the like. The garments refer to clothes, chaussures, and the like. The health articles refer to medical appliances, health appliances, and the like. The livingwares refer to furniture, lighting equipment, and the like. The medicines refer to medical products, pesticides, and the like. The electronic apparatuses refer to liquid crystal display apparatuses, EL display apparatuses, television apparatuses (TV sets or flat-screen televisions), cellular phones, and the like.

The semiconductor device of the present invention is fixed to products by mounting the device onto a print substrate, pasting the device to the surface, or embedding the device in the products. For example, the semiconductor device is embedded in a paper of a book or in organic resin of a package made from the organic resin. Since the semiconductor device of the present invention is realized to be small, thin, and lightweight, design of a product is not detracted after fixating the semiconductor device to the product. A certification function can be provided by providing the semiconductor device to the paper money, the coins, the securities, the bearer bonds, the certificates, and the like. A counterfeit can be prevented by employing the certification function. The efficiency in an inspection system can be promoted by providing the semiconductor device to the packing containers, the recording medium, the personal belongings, the foods, the garments, the livingwares, the electronic apparatuses, and the like.

Figure 12B:
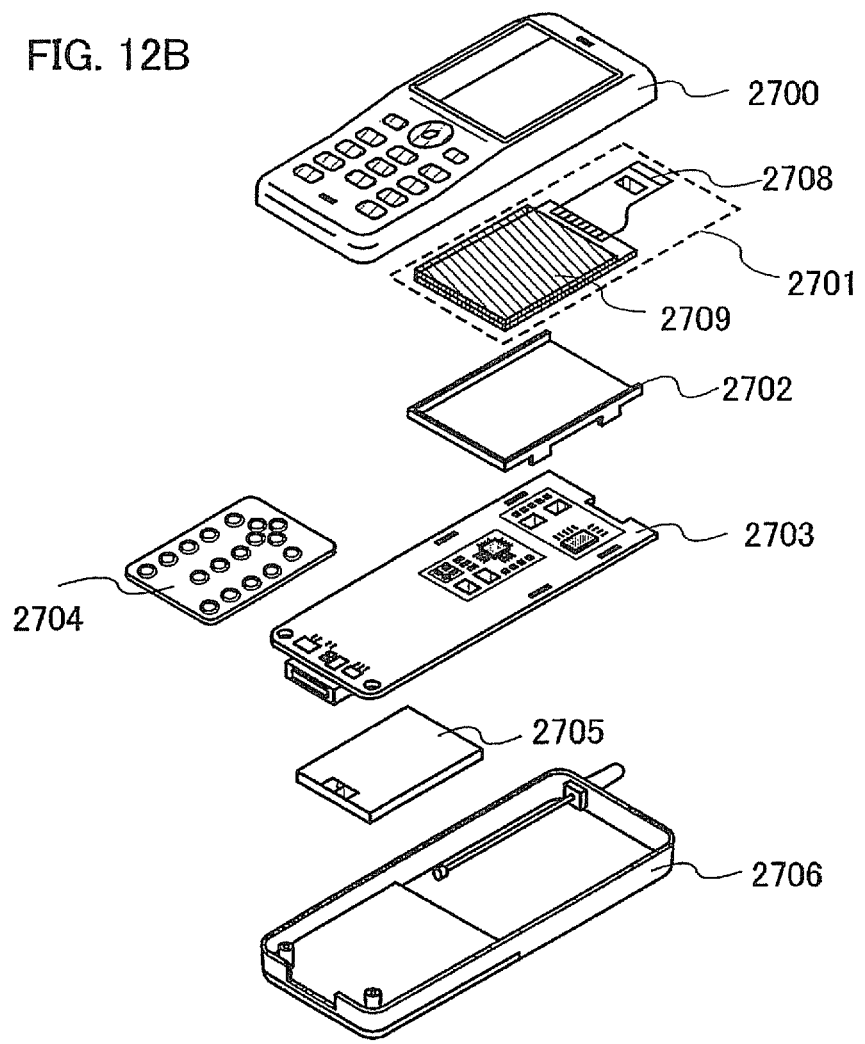

Next, a mode of an electronic apparatus where the semiconductor device of the present invention is mounted is described with reference to the drawings. The electronic apparatus shown here is a cellular phone, which includes frame bodies 2700 and 2706, a panel 2701, a housing 2702, a printed circuit board 2703, operation switches 2704, and a battery 2705 (see FIG. 12B). The panel 2701 is detachably incorporated in the housing 2702. The housing 2702 is fitted into the printed circuit board 2703. A shape and dimension of the housing 2702 are appropriately changed in accordance with the electronic apparatus where the panel 2701 is to be incorporated. Over the printed circuit board 2703, a plurality of packaged semiconductor devices are mounted and the semiconductor device of the present invention can be used as one of the plurality of packaged semiconductor devices. The plurality of semiconductor devices mounted onto the printed circuit board 2703 has any one of functions of a controller, a central processing unit (CPU), a memory, a power supply circuit, an audio processing circuit, a transmitting/receiving circuit, and the like.

The panel 2701 is combined with the printed circuit board 2703 through a connection film 2708. The above panel 2701, the housing 2702, and the printed circuit board 2703 are placed in the frame bodies 2700 and 2706 together with the operation switches 2704 and the battery 2705. A pixel region 2709 in the panel 2701 is provided so as to be observed through an opening window provided in the frame body 2700.

As described above, the semiconductor device of the present invention is small, thin, and lightweight, whereby the limited space in the frame bodies 2700 and 2706 of the electric apparatus can be efficiency used.

Further, since the semiconductor device of the present invention includes a memory element having a simple structure in which an organic compound layer is interposed between a pair of conductive layers, an electric apparatus using an inexpensive semiconductor device can be provided. In addition, since high integration is easy with the semiconductor device of the present invention, an electric apparatus using a semiconductor device including a high-capacity memory circuit can be provided.

Further, a memory device in the semiconductor device of the present invention is nonvolatile and additionally recordable, and the data is written in the memory device by electric action. With this characteristic, the counterfeiting due to the rewriting can be prevented and new data can be additionally written. Therefore, an electric apparatus using a sophisticated and high-value-added semiconductor device can be provided.

It is to be noted that the frame bodies 2700 and 2706 are shown as an example of an exterior of the cellular phone, and the electric apparatus of the present embodiment mode can be changed variously in accordance with the function or the intended purpose thereof.

Embodiment Mode 9

In the present embodiment mode, reading or writing data in a semiconductor device having the above structure will be described.

Figure 18A:
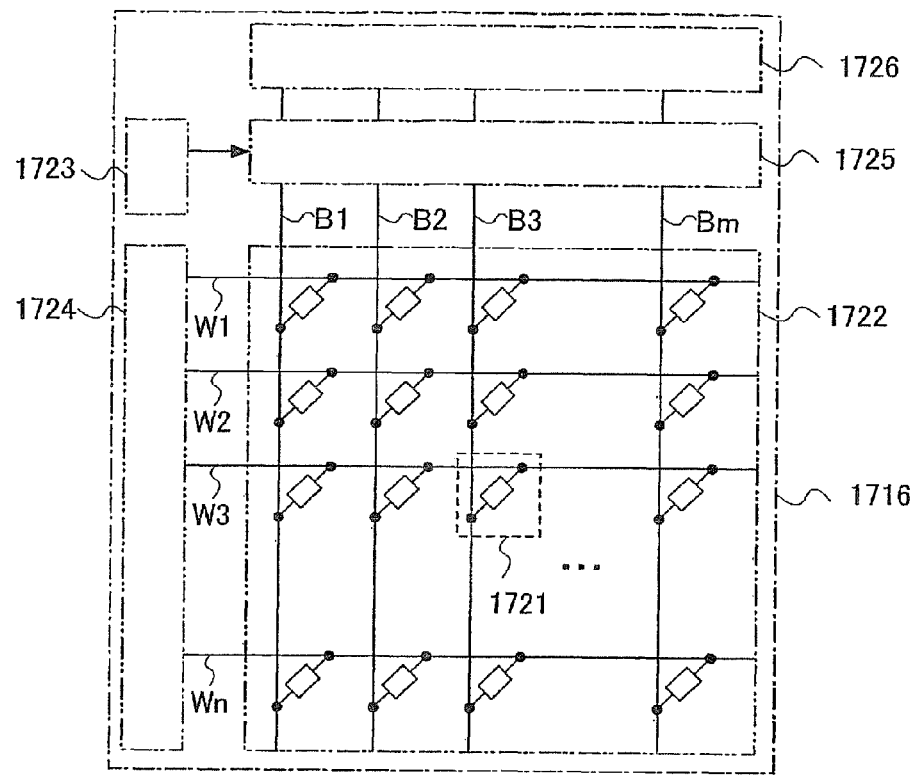
FIGS. 18A to 18C are diagrams describing a memory device of the present invention.
Figure 18B:
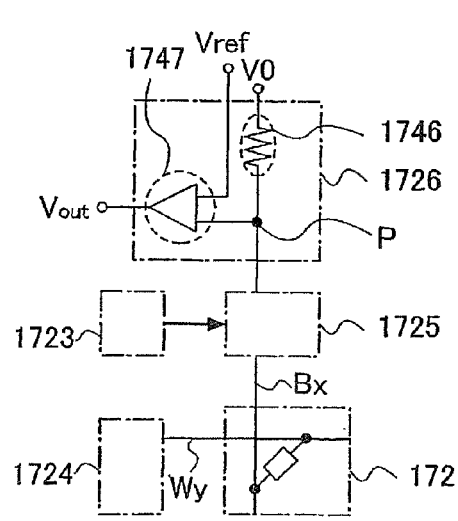
Figure 18C:
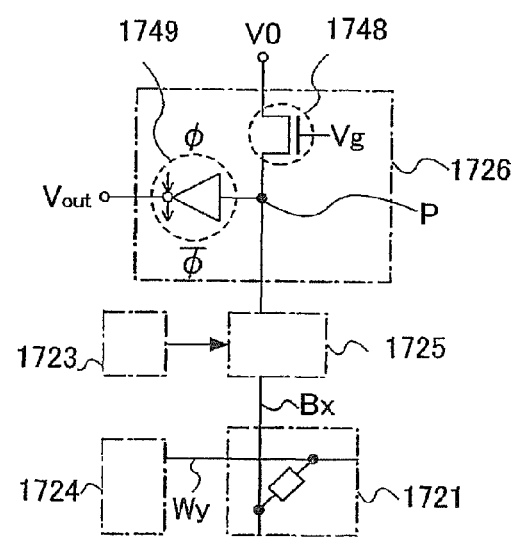

FIGS. 18A to 18C show a configuration example of a semiconductor device of the present invention. The semiconductor device includes a memory cell array 1722 in which memory cells 1721 are arranged in matrix, a circuit 1726 having a reading circuit and a writing circuit, a decoder 1724, and a decoder 1723. It is to be noted that the configuration of a memory device 1716 shown here is only an example, and a semiconductor device may include another circuit such as a sense amplifier, an output circuit, a buffer, and an interface that communicates with outside.

The memory cell 1721 includes a first conductive layer that is connected to a bit line Bx (1≤x≤m), a second conductive layer that is connected to a word line Wy (1≤y≤n), and an organic compound layer. The organic compound layer has a single layer structure or a stacked layer structure between the first conductive layer and the second conductive layer.

First, operation of writing data into a memory element in a memory device having a passive matrix structure is described with references to FIGS. 18A to 18C. Data is written by electric action. Therefore, the case of writing data by electric action is firstly described. Writing is performed by changing electric characteristics of a memory cell, and an initial state (a state without electric action) of the memory cell is used as data "0" and a state in which electric characteristics is changed is used as data "1".

In the case of writing data "1" into the memory cell 1721, the memory cell 1721 is selected first by the decoders 1723 and 1724 and a selector 1725. Specifically, a predetermined voltage V2 is applied to a word line W3 connected to the memory cell 1721 by the decoder 1724. A bit line B3 connected to the memory cell 1721 is connected to a circuit 1726 by the decoder 1723 and the selector 1725. Then, a writing voltage V1 is outputted from the circuit 1726 to the bit line B3.

Thus, electric potential Vw=V1−V2 is applied between the first conductive layer and the second conductive layer included in the memory cell 1721. By selecting appropriate electric potential Vw, an organic compound layer provided between the conductive layers is changed physically or electrically to write data "1". Specifically, at a reading operation voltage, electric resistance between the first conductive layer and second conductive layer in the state of data "1" may be changed so as to be drastically lowered compared with the electric resistance in the state of data "0". For example, the voltage may be appropriately selected from the range of (V1, V2)=(0 V, 5 V to 15 V) or (3 V to 5 V, −12 V to −2 V). The electric potential Vw may be 5V to 15V or −5V to −15V.

A non-selected word line and a non-selected bit line are controlled so that data "1" is not written into the memory cell that is to be connected to the non-selected word line and the non-selected bit line. For example, the non-selected word line and the non-selected bit line may be in a floating state. Characteristics that can ensure selectivity such as diode characteristics are required between the first conductive layer and second conductive layer included in the memory cell.

On the other hand, in the case of writing data "0" into the memory cell 1721, electric action is not required to be applied to the memory cell 1721. In circuit operation, for example, the memory cell 1721 is selected by the decoders 1723 and 1724 and the selector 1725 in the similar way as the case of writing data "1". Then, the output electric potential from the circuit 1726 to the bit line B3 may be set to be equivalent to electric potential of a selected word line W3 or electric potential of a non-selected word line, and such a voltage (for example, −5 V to 5 V) that does not change the electric characteristics of the memory cell 1721 may be applied between the first conductive layer and second conductive layer included in the memory cell 1721.

Subsequently, operation of reading data from a memory element in a memory device having passive matrix structure is described (see FIGS. 18A to 18C). Reading data is performed by utilizing electric characteristics between a first conductive layer and a second conductive layer included in a memory cell, which are different between a memory cell having data "0" and a memory cell having data "1". For example, a reading method utilizing the difference in electric resistance is described, where the effective electric resistance between a first conductive layer and a second conductive layer included in a memory cell (hereinafter also simply referred to as electric resistance of the memory cell) with data "0" is R0 at a reading voltage, and the electric resistance of a memory cell with data "1" is R1 at a reading voltage (R1<<R0). As for a reading/writing circuit, for example, a circuit 1726 using a resistance element 1746 and a differential amplifier 1747 shown in FIG. 18B can be conceivable as a structure of its reading portion. The resistance element 1746 has a resistance value Rr (R1<Rr<R0). A transistor 1748 may be used instead of the resistance element 1746 and a clocked inverter 1749 can be used instead of the differential amplifier (FIG. 18C). A signal φ or an inverted signal φ that is Hi when reading is performed and Lo when reading is not performed is inputted into the clocked inverter 1749. Naturally, the circuit configuration is not limited to FIGS. 18A to 18C.

In the case of reading data from the memory cell 1721, the memory cell 1721 is selected first by the decoders 1723 and 1724 and the selector 1725. Specifically, a predetermined voltage Vy is applied to a word line Wy connected to the memory cell 1721 by the decoder 1724. A bit line Bx connected to the memory cell 1721 is connected to a terminal P of the circuit 1726 by the decoder 1723 and the selector 1725. As a result, electric potential Vp of the terminal P is a value determined by resistance division by the resistance element 1746 (resistance value: Rr) and the memory cell 1721 (resistance value: R0 or R1). Therefore, the equation Vp0=Vy+(V0−Vy)×R0/(R0+Rr) is made in the case where the memory cell 1721 has data "0". Alternatively, the equation Vp1=Vy+(V0−Vy)×R1/(R1+Rr) is made in the case where the memory cell 1721 has data "1". As a result, by selecting Vref so as to be between Vp0 and Vp1 in FIG. 18B or by selecting the change point of the clocked inverter between Vp0 and Vp1 in FIG. 18C, output electric potential Vout of Lo/Hi (or Hi/Lo) is outputted in accordance with data "0"/"1", so that reading can be performed.

For example, it is assumed that the differential amplifier is operated at Vdd=3 V, and Vy, V0, and Vref are 0 V, 3 V, and 1.5 V, respectively. On the condition of R0/Rr=Rr/R1=9, Hi is outputted as Vout in accordance with Vp0=2.7 V when the memory cell has data "0", or Lo is outputted as Vout in accordance with Vp1=0.3 V when a memory cell has data "1". In this way, reading of a memory cell can be performed.

In accordance with the above method, the state of electric resistance of an organic compound layer is read at a voltage value utilizing the difference in a resistance value and resistance division. Naturally, the reading method is not limited thereto. For example, reading may be performed utilizing the different in current values other than utilizing the difference in electric resistant. In the case where electric characteristics of the memory cell have different diode characteristics between threshold voltages in the case of data "0" and data "1", reading may be performed utilizing the difference in the threshold voltage.

Next, operation of writing data into a memory element in a memory device having an active matrix structure is described (see FIGS. 19A to 19C).

FIGS. 19A to 19C show a configuration example of a memory device shown in the present embodiment mode. The memory device includes a memory cell array 1232 in which memory cells 1231 are arranged in matrix, a circuit 1226, a decoder 1224, and a decoder 1223. The circuit 1226 has a reading circuit and a writing circuit. It is to be noted that the configuration of a memory device 1217 shown here is only an example, and a memory device may include another circuit such as a sense amplifier, an out put circuit, a buffer, and an interface that communicates with outside.

The memory cell array 1232 includes a first wiring that is connected to a bit line Bx (1≤x≤m), a second wiring that is connected to a word line Wy (1≤y≤n), a transistor 1210a, a memory element 1215b, and the memory cell 1231. The memory element 1215b has a structure in which an organic compound layer is interposed between a pair of conductive layers. A gate electrode of the transistor is connected to the word line. Either a source electrode or a drain electrode is connected to the bit line, and the other electrode is connected to one of two terminals included in the memory element. The other terminal of the memory element is connected to a common electrode (electric potential, Vcom).

First, operation of writing data by electric action is described. It is to be noted that writing is performed by changing electric characteristics of the memory cell, and an initial state (a state without electric action) of the memory cell is data "0" and a state in which the electric characteristics is changed is data "1".

Here, the case of writing data into the memory cell 1231 in the n-th row and m-th column is described. In the case of writing data "1" into the memory cell 1231, the memory cell 1231 is selected first by the decoders 1223 and 1224 and the selector 1225. Specifically, a predetermined voltage V22 is applied to a word line Wn connected to the memory cell 1231 by the decoder 1224. In addition, a bit line Bm connected to the memory cell 1231 is connected to the circuit 1226 having a reading circuit and a writing circuit by the decoder 1223 and the selector 1225. Then, a writing voltage V21 is outputted from the circuit 1226 into a bit line B3.

In this manner, a transistor 1210a included in the memory cell is turned on, and the memory element 1215b is electrically connected to the bit line to apply electric potential (voltage) of approximately Vw=Vcom−V21. It is to be noted that one of electrodes of the memory element 1215b is connected to a common electrode of which electric potential is Vcom. An organic compound layer provided between the conductive layers is changed physically or electrically by appropriately selecting the electric potential Vw so that data "1" is written. Specifically, in a reading operation voltage, electric resistance between the first conductive layer and second conductive layer in the state of data "1" may be changed so as to be drastically lowered compared with the electric resistance in the state of data "0", or simply, short circuit may be caused. The electrical potential may be appropriately selected from the range of (V21, V22, Vcom)=(5 V to 15 V, 5 V to 15 V, 0 V) or (−12 V to 0 V, −12 V to 0 V, 3 V to 5 V). The electric potential Vw may be 5 V to 15 V or −5 V to −15 V.

A non-selected word line and a non-selected bit line are controlled so that data "1" is not written into a memory cell that is to be connected to each of the non-selected word line and the non-selected bit line. Specifically, electric potential (for example, 0 V) for turning off the transistor in the memory cell that is to be connected may be applied to the non-selected word line, and the non-selected bit line may be in a floating state or electric potential appropriately equivalent to Vcom may be applied to the non-selected bit line.

On the other hand, in the case of writing data "0" into the memory cell 1231, electric action is not required to be applied to the memory cell 1231. In circuit operation, for example, although the memory cell 1231 is selected by the decoders 1223 and 1224 and the selector 1225 in the similar way as the case of writing data "1", an output electric potential from the circuit 1226 to the bit line B3 is set to be equivalent to the Vcom or the bit line 133 is set to be in a floating state. As a result, low electric potential (for example, −5 V to 5 V) or no electric potential (no voltage) is applied; therefore, electric characteristics are not changed and writing data "0" is realized.

Next, operation of reading data by electric action is described. Here, the circuit 1226 has a configuration including a resistance element 1246 and a different amplifier 1247. However, a configuration of the circuit 1226 is not limited to the above, and any configuration may be employed.

Subsequently, operation of reading data by electric action in a memory device that has an active matrix structure is described. Reading data is performed by utilizing electric characteristics of the memory element 1215b, which are different between a memory cell with data "0" and a memory cell with data "1". For example, a reading method by utilizing the difference in electric resistance is described, where electric resistance of the memory element included in the memory cell with data "0" is R0 at a reading voltage, and electric resistance of the memory element included in the memory cell with data "1" is R1 at a reading voltage (R1<<R0). As for a reading/writing circuit, for example, the circuit 1226 using the resistance element 1246 and the different amplifier 1247 shown in FIG. 19B is conceivable as a structure of its reading portion. The resistance element has a resistance value of Rr (R1<Rr<R0). A transistor 1249 may be used instead of the resistance element 1246 and a clocked inverter 1248 can be used instead of the different amplifier (FIG. 19C). Naturally, a circuit configuration is not limited to FIGS. 19A to 19C.

In the case of reading data from the memory cell 1231 in the x-th row and the y-th column, the memory cell 1231 is selected first by the decoders 1223 and 1224 and the selector 1225. Specifically, a predetermined voltage V24 is applied to a word line Wy connected to the memory cell 1231 by the decoder 1224 to turn on a transistor 1210a. In addition, a bit line Bx connected to the memory cell 1231 is connected to a terminal P of the circuit 1226 by the decoder 1223 and the selector 1225. As a result, electric potential. Vp of the terminal P is a value determined by resistance division of Vcom and V0 by the resistance element 1246 (a resistance value: Rr) and the memory element 1215b (a resistance value: R0 or R1). Therefore, the equation Vp0=Vcom+(V0−Vcom)×R0/(R0+Rr) is made in the case where the memory cell 1231 has data "0". Alternatively, the equation Vp1=Vcom+(V0−Vcom)×R1/(R1+Rr) is made in the case where the memory cell 1231 has data "1". As a result, by selecting Vref so as to be between Vp0 and Vp1 in FIG. 19B or by selecting the change point of the clocked inverter so as to be between Vp0 and Vp1 in FIG. 19C, Lo/Hi (or Hi/Lo) of output electric potential Vout is outputted in accordance with data "0"/"1" so that reading can be performed.

For example, the differential amplifier is operated at Vdd=3 V, and Vcom, V0, and Vref are 0 V, 3 V, and 1.5 V, respectively. On the condition that the equation R0/Rr=Rr/R1=9 holds and on-resistance of the transistor 1210a can be ignored, Hi is outputted as Vout at Vp0=2.7 V when a memory cell has data "0", or Lo is outputted as Vout at Vp1=0.3 V when a memory cell has data "1". In this way, reading from a memory cell can be performed.

In accordance with the above method, reading is performed by a voltage value utilizing the difference in a resistance value of the memory element 1215b and resistance division. Naturally, the reading method is not limited thereto. For example, reading may be performed by utilizing the difference in current values other than the method utilizing the difference in electric resistance. In the case where electric characteristics of the memory cell have different diode characteristics in threshold voltages in the case of data "0" and data "1", reading may be performed by utilizing difference in the threshold voltages.

A memory element having the above structure and a memory device including the memory element are a nonvolatile memory; therefore, an electric battery for storing data is not required to be incorporated, and a small-sized, thin, and lightweight memory device and a semiconductor device thereof can be provided. Further, by using the insulating material used in the above embodiment modes as an organic compound layer, data cannot be rewritten though data can be written (additionally). Accordingly, counterfeits can be prevented and a memory device and a semiconductor device with ensured security can be provided.

It is to be noted that the present embodiment mode can be performed freely by combining the memory element, and the structure of the memory device and the semiconductor device, which include the memory element shown in the above embodiment mode.

Embodiment

In the present embodiment, a memory element using the present invention is manufactured, and an example of evaluating characteristics thereof is shown.

Figure 20A:
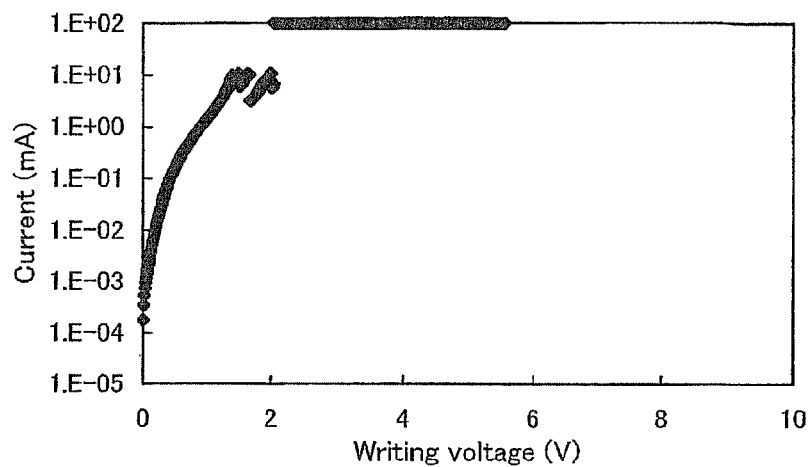
FIGS. 20A to 20C are graphs of experimental data of comparative examples.
Figure 20B:
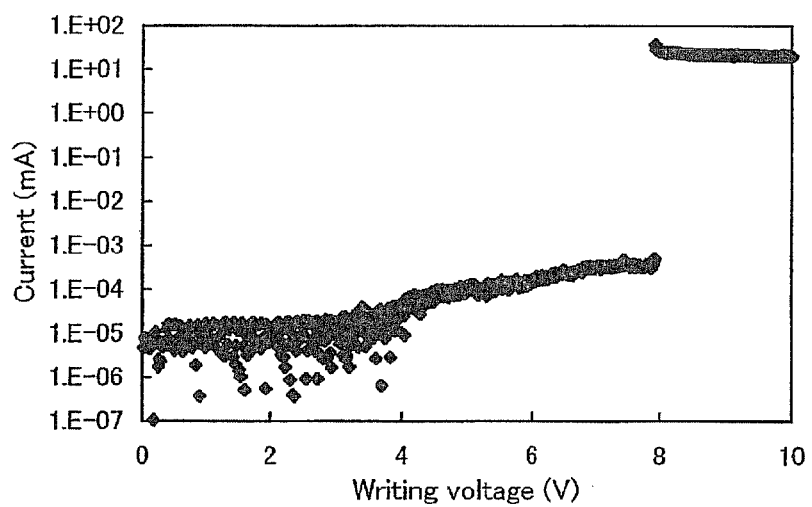
Figure 20C:
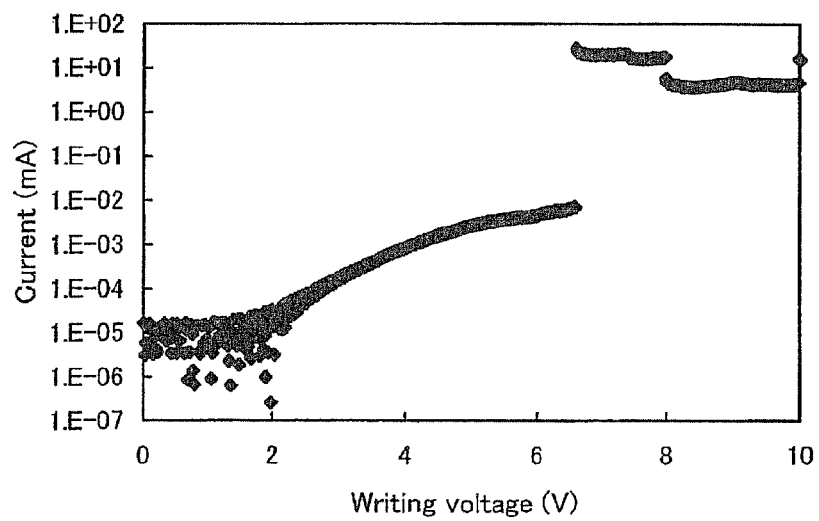

First, memory elements that do not have an insulator (sample 1 to sample 3) as a comparative example are manufactured, and a writing voltage and a current value just before writing are measured. As a structure of the memory elements of the samples 1 to 3, a stacked layer structure of a first conductive layer, an organic compound layer, and a second conductive layer is employed. A titanium film with a film thickness of 100 nm as the first conductive layer and an NPB film with a film thickness of 8 nm as the organic compound layer are stacked, and then, an aluminum film with a film thickness of 200 nm as the second conductive layer is formed thereover. The samples 1 to 3 are memory elements of which shapes are squares. Each of the samples 1 and 2 is a memory element having a square shape of which length of one side is 10 μm, and the sample 3 is a memory element having a square shape of which length of one side is 20 μm. In the present specification, a memory element is a stacked layer region including at least one of a first conductive layer, an organic compound layer, and a second conductive layer. In addition, a shape of the memory element is a shape of its stacked body. Each writing voltage and current of the sample 1, the sample 2, and the sample 3 is shown in FIG. 20A, FIG. 20B, and FIG. 20C, respectively. It is to be noted that, as a writing method in this case, sweep measure by which a current value of the samples in each voltage is measured with increasing a voltage by every 0.1 V from 0 V, is performed.

Although the memory elements of the sample 1 and the sample 2 in FIGS. 20A and 20B have the same structure and the same size, characteristics of a writing voltage and a current (also called I-V characteristics) is different from each other, and there is no consistency. Therefore, variation in writing conduct among similar memory elements is generated. Furthermore, even if the memory elements are compared to an element in FIG. 20C showing I-V characteristics of the sample 3, which has the different size of 20 μm×20 μm, writing conduct of the sample 1 and the sample 2 shown in FIGS. 20A and 20B has no consistency, and there is variation.

Figure 21:
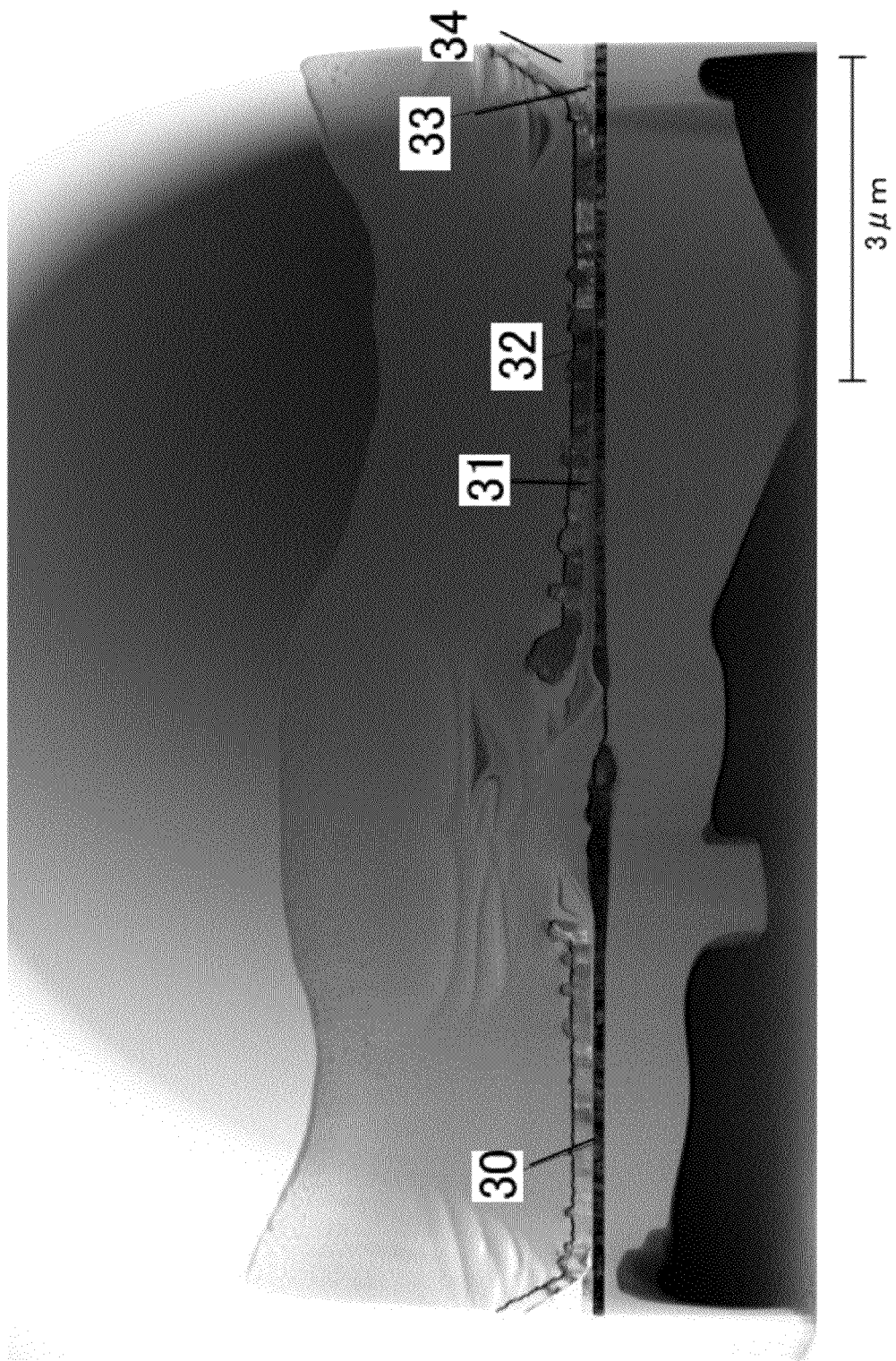
FIG. 21 is a sectional-photograph of a memory element of an comparative example.

FIG. 21 shows a cross-sectional view of a memory element after writing (a sample 4) (a STEM photograph observed by a transmission electron microscopy (TEM) method). The memory element of the sample 4 shown in FIG. 21 is formed of a stacked layer of a titanium film 30 that is a bottom electrode layer, an NPB film 31 that is an organic compound layer, and an aluminum film 32 that is an upper electrode layer. Further, a partition wall 34 and an aluminum film 33 are formed on its periphery.

As shown in FIG. 21, the aluminum film that is an upper electrode layer is broken due to a concentration of electricity. There is a possibility that short-circuit between an upper electrode and a bottom electrode is caused on the periphery of the broken aluminum. Heat and a charge are generated when the upper electrode layer is broken; then, the shapes of the partition wall 34 and the titanium film 30 that is the bottom electrode are affected due to the heat and the charge. Therefore, the shapes are changed.

Figure 22:
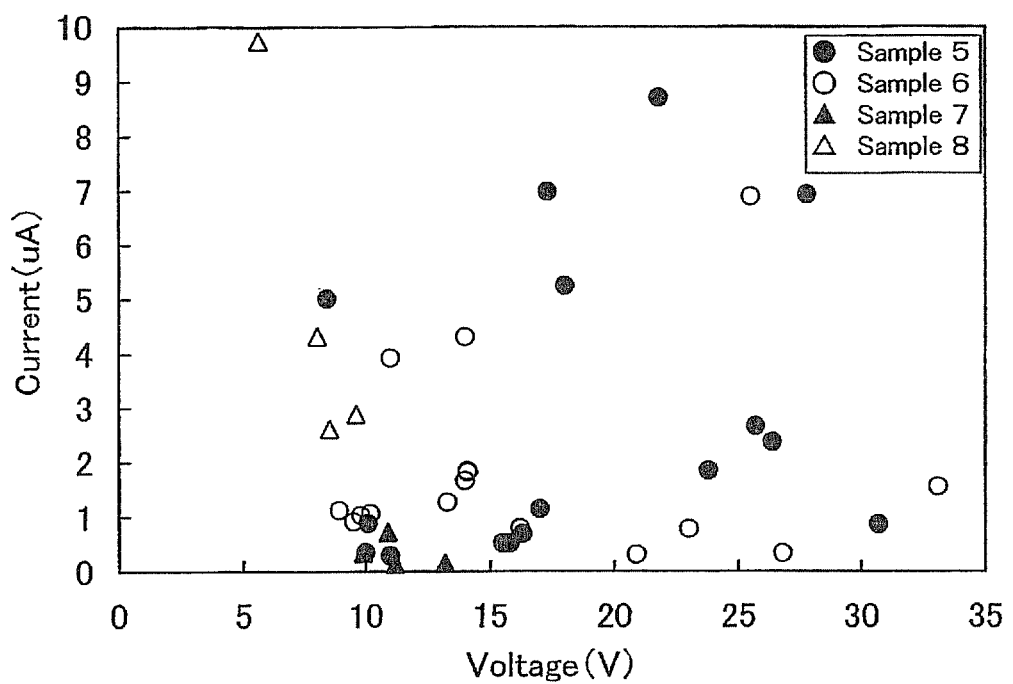
FIG. 22 is a characteristic graph of a memory element in Embodiment 1.

On the other hand, a memory element having an insulator as the present invention is manufactured, and a writing voltage and a current are measured. As a sample, samples (a sample 5 and a sample 6) having a stacked layer structure of a first conductive layer (a titanium film), an insulating layer (a lithium fluoride film with a film thickness of 1 nm), an organic compound layer (an NPB film with a film thickness of 10 nm), and a second conductive layer (an aluminum film), in which an insulator is provided as a buffer layer in a thin film state, are manufactured. Samples (a sample 7 and a sample 8) having a stacked layer structure of a first conductive layer (a titanium film), an organic compound (NPB) layer including an insulator (lithium fluoride) (a film thickness of 20 nm) (a volume ratio of lithium fluoride and NPB is 1:1), and a second conductive layer (an aluminum film), in which an insulator is mixed in an organic compound as the present invention, are also manufactured. In the sample 5 and the sample 7, a size of each memory element is 2 µm×2 µm. In the sample 6 and the sample 8, a size of each memory element is 3 µm×3 µm. A writing voltage and a current value just before writing of the samples 5 to 8 are shown in FIG. 22. In FIG. 22, as each of the samples 5 to 8, a plurality of elements are manufactured and measured under the same condition. The elements manufactured under the same condition are represented by the same dots in the graph. In FIG. 22, the measurement data of the samples 5 to 8 is represented as follows: the samples 5 are represented as black circles; the samples 6 are represented as white circles; the samples 7 are represented as black triangles; and the samples 8 are represented as white triangles.

As shown in FIG. 22, the memory elements each having an organic compound layer including an insulator of the present invention (the samples 7 and the samples 8) have a little variation in the writing voltage and the current. Alternatively, in the memory elements each having a buffer layer of a thin-film insulator between the first conductive layer and the organic compound layer (the sample 5 and the sample 6), there are some memory elements with high writing voltage.

When the memory element is manufactured under a bad film forming condition, unusual element characteristics may be shown. By forming memory elements by including an insulator in an organic compound layer as the present invention, a state of the organic compound layer (morphology) is stabilized, and uniformity of a film thickness can be improved. Accordingly, the element characteristics are stabilized without variation. Further, since the insulator and the organic compound layer are not required to be formed in a separation process, the process can be simplified.

Subsequently, memory elements each having an organic compound layer including an insulator of the present invention (samples 9 to 11) are manufactured, and a writing voltage and a current value just before writing are manufactured. As the samples, the sample 9 having a stacked layer structure of a first conductive layer (a titanium film), an organic compound (NPB) layer including an insulator (lithium fluoride) (a film thickness of 20 nm) (a volume ratio of lithium fluoride and NPB is 1:1), and a second conductive layer (an aluminum film) is manufactured. Further, the sample 10 having a stacked layer structure of a first conductive layer (a titanium film), an organic compound (NPB) layer including an insulator (calcium fluoride) (a film thickness of 20 nm) (a volume ratio of calcium fluoride and NPB is 1:1), and a second conductive layer (an aluminum film) is manufactured. Furthermore, the sample 11 having a stacked layer structure of a first conductive layer (a titanium film), an organic compound (TPAQn) layer including an insulator (lithium fluoride) (a film thickness of 12 nm) (a volume ratio of lithium fluoride and TPAQn is 1:1), and a second conductive layer (an aluminum film) is manufactured. The sample 10 in which an insulating layer in a thin film a state and the organic compound layer including an insulator are stacked, is an example where the structure has a concentration gradient of an insulator in a memory element.

Figure 23A:
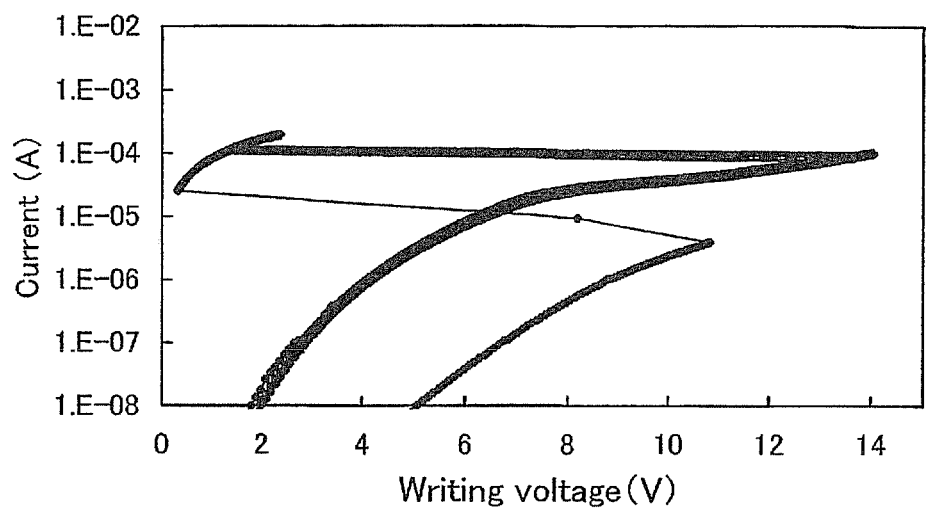
FIGS. 23A and 23B are characteristic graphs of a memory element in Embodiment 1.
Figure 23B:
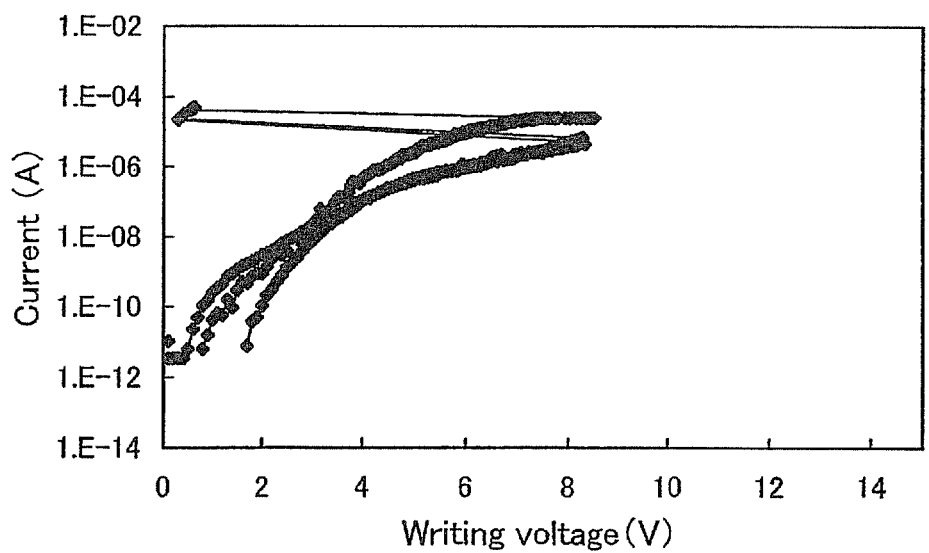
Figure 24:
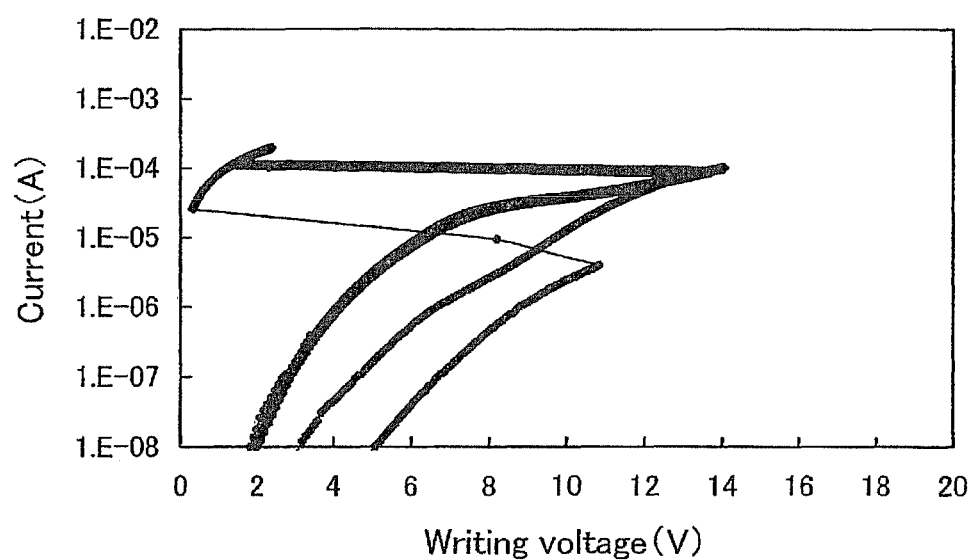
FIG. 24 is a characteristic graph of a memory element in Embodiment 1.

A writing voltage and a current of the sample 9, the sample 10, and the sample 11 are respectively shown in FIG. 23A, FIG. 23B, and FIG. 24A. As a writing method in this case, sweep measure by which a current value of the samples in each voltage is measured with increasing a voltage by every 0.1 V from 0 V, is performed. As shown in FIGS. 23A and B, and FIG. 24, in the samples 9 to 11, writing current and voltage characteristics (I-V characteristics) of an element is stabilized without variation, and conduct can be stabilized. Further, after writing, resistance is not remained in the memory elements, and resistance is almost disappeared.

Figure 25:
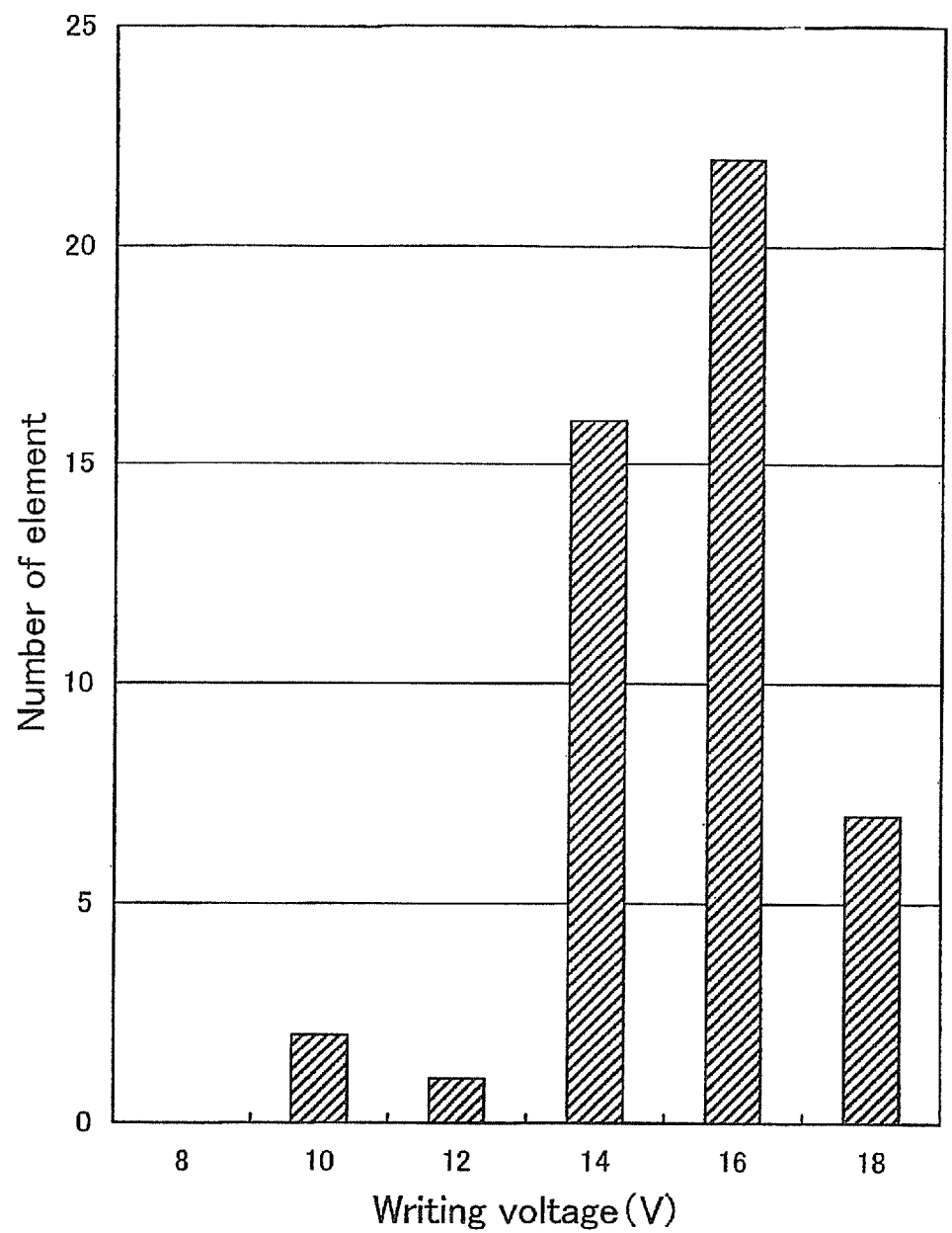
FIG. 25 is a characteristic graph of a memory element in Embodiment 1.

A result is shown, in which writing is performed into a memory element (a sample 12) having a stacked layer structure of a first conductive layer (a titanium film), an organic compound (TPAQn) layer including an insulator (lithium fluoride) (a film thickness of 12 nm) (volume ratio of lithium fluoride and TPAQn is 1:1), and a second conductive layer (an aluminum film), which uses the present invention having the similar structure as the sample 11. As a writing method in this case, a pulse voltage of 10 $ms^{-1}$ is applied to perform the writing into the memory element. FIG. 25 shows a number of writing elements with respect to each writing voltage. Writing of the memory element is performed in a range of a writing voltage of a certain degree. Therefore, it is confirmed that the element using the present invention can be sufficiently used for a memory element.

In accordance with the above, it is possible that characteristics of writing voltage of the memory element or the like is stabilized without variation by the memory element of the present invention, and that normal writing is performed in each element. Further, since a carrier injecting property is improved by a tunnel current of a mixed layer of an inorganic compound and an organic compound, an organic compound layer can be thickened. Therefore, a defect in which the memory element is short-circuited in an initial state before having conductivity can be prevented. As a result, a memory device and a semiconductor device, each of which has high reliability can be provided with high yield.

What is claimed is:

1. A method for manufacturing a semiconductor device, comprising the steps of:
    forming a first conductive layer;
    forming an organic compound layer comprising an insulator over the first conductive layer; and
    forming a second conductive layer over the organic compound layer,
    wherein the organic compound layer comprises a plurality of insulating particles dispersed in the organic compound layer.

2. A method for manufacturing a semiconductor device according to claim 1, wherein the organic compound layer is formed to have a concentration gradient of the insulator.

3. A method for manufacturing a semiconductor device according to claim 1, wherein a concentration of the insulator in the organic compound layer at a first interface between the organic compound layer and the first conductive layer is higher than a concentration of the insulator in the organic compound layer at a second interface between the organic compound layer and the second conductive layer.

4. A method for manufacturing a semiconductor device according to claim 1, wherein a concentration of the insulator in the organic compound layer at a first interface between the organic compound layer and the second conductive layer is higher than a concentration of the insulator in the organic compound layer at a second interface between the organic compound layer and the first conductive layer.

5. A method for manufacturing a semiconductor device according to claim 1, wherein the first conductive layer and the second conductive layer comprises an insulator.

6. A method for manufacturing a semiconductor device, comprising the steps of:
    forming a first conductive layer;
    discharging and solidifying a composition comprising an insulator and an organic compound over the first conductive layer to form an organic compound layer; and forming a second conductive layer over the organic compound layer.

7. A method for manufacturing a semiconductor device according to claim 6, wherein the organic compound layer comprises a plurality of insulating particles dispersed in the organic compound layer.

8. A method for manufacturing a semiconductor device according to claim 6, wherein the organic compound layer is formed to have a concentration gradient of the insulator.

9. A method for manufacturing a semiconductor device according to claim 6, wherein a concentration of the insulator in the organic compound layer at a first interface between the organic compound layer and the first conductive layer is higher than a concentration of the insulator in the organic compound layer at a second interface between the organic compound layer and the second conductive layer.

10. A method for manufacturing a semiconductor device according to claim 6, wherein a concentration of the insulator in the organic compound layer at a first interface between the organic compound layer and the second conductive layer is higher than a concentration of the insulator in the organic compound layer at a second interface between the organic compound layer and the first conductive layer.

11. A method for manufacturing a semiconductor device according to claim 6, wherein the first conductive layer and the second conductive layer comprises an insulator.

12. A method for manufacturing a semiconductor device, comprising the steps of:
   forming a first conductive layer;
   forming an organic compound layer over the first conductive layer;
   adding an insulator into the organic compound layer; and
   forming a second conductive layer over the organic compound layer,
   wherein a plurality of insulating particles is dispersed in the organic compound layer by adding the insulator into the organic compound layer.

13. A method for manufacturing a semiconductor device according to claim 12, wherein the organic compound layer has a concentration gradient of the insulator by adding the insulator into the organic compound layer.

14. A method for manufacturing a semiconductor device according to claim 12, wherein a concentration of the insulator in the organic compound layer at a first interface between the organic compound layer and the first conductive layer is higher than a concentration of the insulator in the organic compound layer at a second interface between the organic compound layer and the second conductive layer.

15. A method for manufacturing a semiconductor device according to claim 12, wherein a concentration of the insulator in the organic compound layer at a first interface between the organic compound layer and the second conductive layer is higher than a concentration of the insulator in the organic compound layer at a second interface between the organic compound layer and the first conductive layer.

16. A method for manufacturing a semiconductor device according to claim 12, wherein the first conductive layer and the second conductive layer comprises an insulator.

* * * * *